United States Patent
Kondo et al.

(10) Patent No.: US 8,268,650 B2
(45) Date of Patent: Sep. 18, 2012

(54) PROCESS FOR MANUFACTURING SEALED ORGANIC ELECTROLUMINESCENCE DEVICES

(75) Inventors: Kunio Kondo, Chiba (JP); Kanjiro Sako, Chiba (JP); Katsumasa Hirose, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/054,887

(22) PCT Filed: Jul. 17, 2009

(86) PCT No.: PCT/JP2009/062991
§ 371 (c)(1),
(2), (4) Date: Jan. 19, 2011

(87) PCT Pub. No.: WO2010/010855
PCT Pub. Date: Jan. 28, 2010

(65) Prior Publication Data
US 2011/0129951 A1   Jun. 2, 2011

(30) Foreign Application Priority Data
Jul. 22, 2008   (JP) .................................. 2008-188770

(51) Int. Cl.
*H01L 51/00* (2006.01)
(52) U.S. Cl. .................................. 438/26; 257/E51.018
(58) Field of Classification Search ............. 438/26–28, 438/99; 257/40, E51.018–E51.022
See application file for complete search history.

(56) References Cited

U.S. PATENT DOCUMENTS

| | | |
|---|---|---|
| 7,485,580 B2 | 2/2009 | Johnson et al. |
| 7,776,645 B2 | 8/2010 | Nagayama et al. |
| 2005/0285509 A1 | 12/2005 | Funamoto et al. |
| 2006/0246620 A1 | 11/2006 | Nagayama et al. |
| 2006/0278945 A1* | 12/2006 | Sakurai .................. 257/433 |
| 2007/0053202 A1 | 3/2007 | Sera et al. |
| 2007/0128346 A1* | 6/2007 | Shen et al. .................. 427/64 |
| 2009/0014412 A1 | 1/2009 | Nozawa et al. |

FOREIGN PATENT DOCUMENTS

| | | |
|---|---|---|
| EP | 1764848 A2 | 3/2007 |
| JP | 08-157575 A | 6/1996 |

(Continued)

OTHER PUBLICATIONS

J. Li, et al., Enhanced performance of organic light emitting device by insertion of conducting/insulating WO3 anodic buffer layer, Synthetic Metals 151 (2005), pp. 141-146.

(Continued)

*Primary Examiner* — Julio J Maldonado
*Assistant Examiner* — Daniel Shook
(74) *Attorney, Agent, or Firm* — Sughrue Mion, PLLC

(57) ABSTRACT

A process for manufacturing sealed organic EL devices includes a step of forming an organic EL layer on a region of an anode-mounted substrate having a substrate and an anode, the region including at least a bonding region in which a sealing member will be bonded and a region which is found inward the bonding region; a step of removing a portion of the organic EL layer which is found at least on the bonding region by applying plasma by a remote plasma method to expose the bonding region; a step of forming a cathode on the organic EL layer to complete an organic EL device; and a step of bonding a sealing member to the exposed bonding region.

9 Claims, 17 Drawing Sheets

FOREIGN PATENT DOCUMENTS

| | | |
|---|---|---|
| JP | 09-232293 A | 9/1997 |
| JP | 10-001665 A | 1/1998 |
| JP | 10-199697 A | 7/1998 |
| JP | 2002-151476 A | 5/2002 |
| JP | 2003-197397 A | 7/2003 |
| JP | 2004-127660 A | 4/2004 |
| JP | 2004-152512 A | 5/2004 |
| JP | 2005-108575 A | 4/2005 |
| JP | 2005-276803 A | 10/2005 |
| JP | 2006-210154 A | 8/2006 |
| JP | 2007-095659 A | 4/2007 |
| JP | 2007-242436 A | 9/2007 |
| WO | 2007/097329 A1 | 8/2007 |

OTHER PUBLICATIONS

G. Wilkinson (Ed.), The Synthesis, Reactions, Properties & Applications of Coordination Compounds, Comprehensive Coordination Chemistry, vol. 2, 1987, pp. 715-738 and pp. 793-812.

Y. Ohmori, Recent Development of Highly Efficient Organic EL Materials, Oyo Buturi, vol. 70, No. 12, (2001), pp. 1419-1425.

A. Yamamoto, et al., Organic Metal Chemistry, Fundamentals and Applications, 1982, pp. 135-177.

* cited by examiner

[Fig. 1]
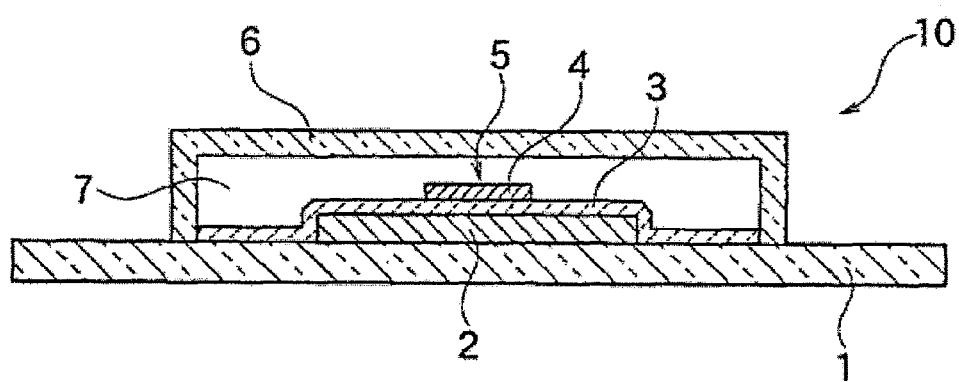

[Fig. 2]
Step(A)
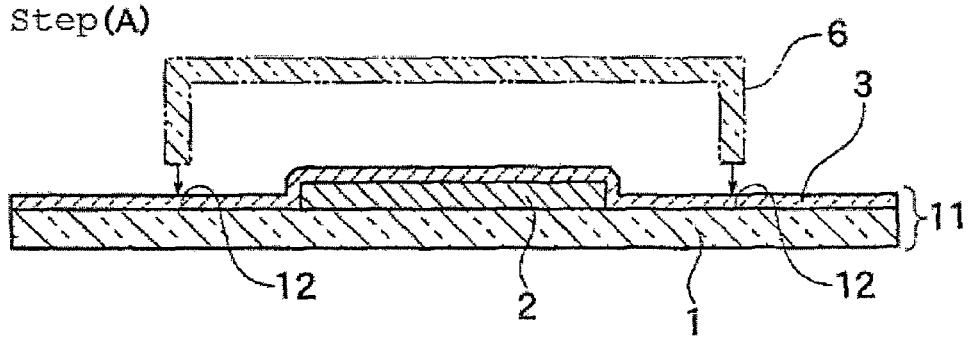
Step(B)
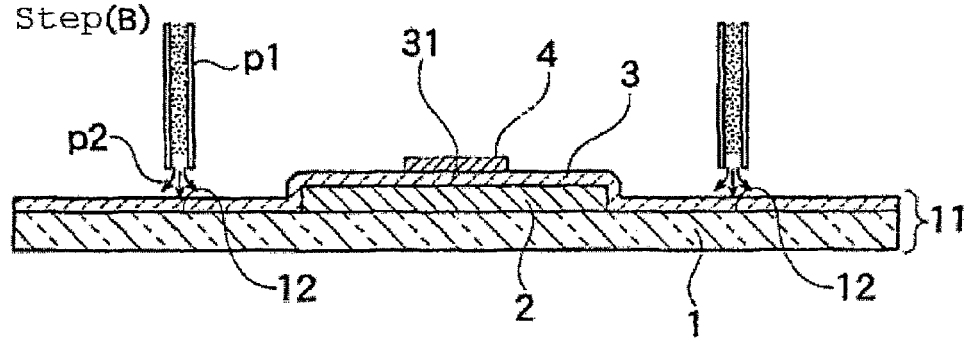
Step(C)
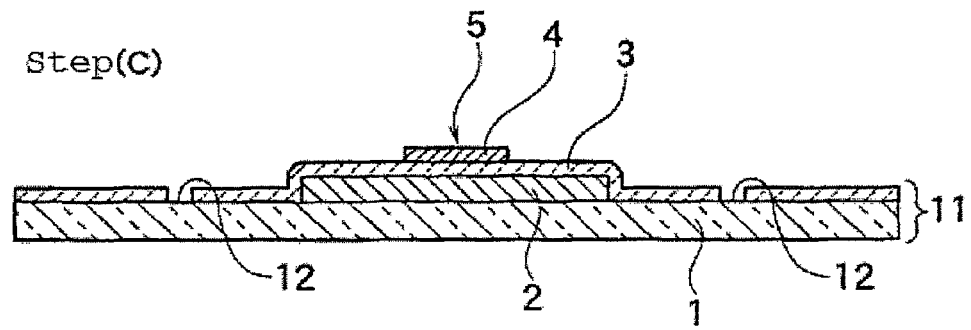
Step(D)
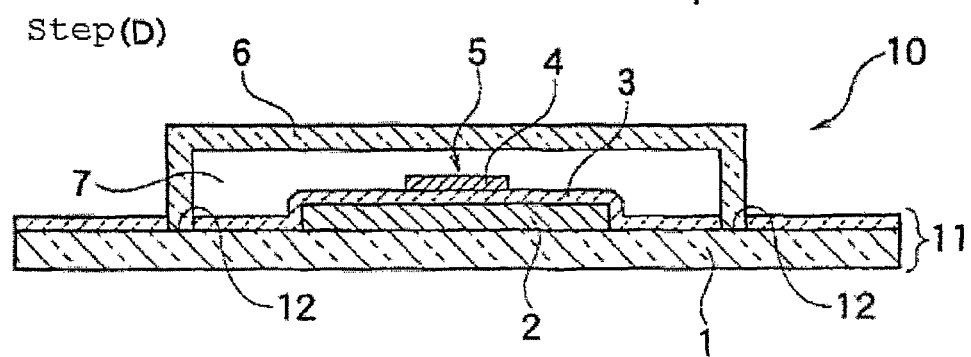

[Fig. 3]
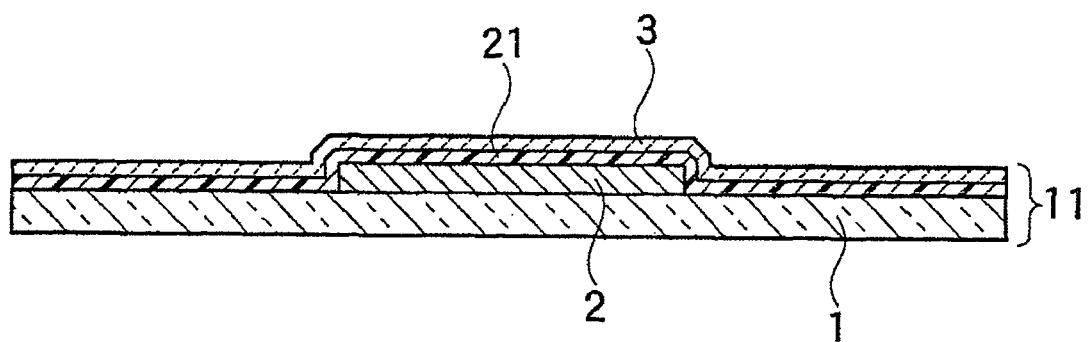

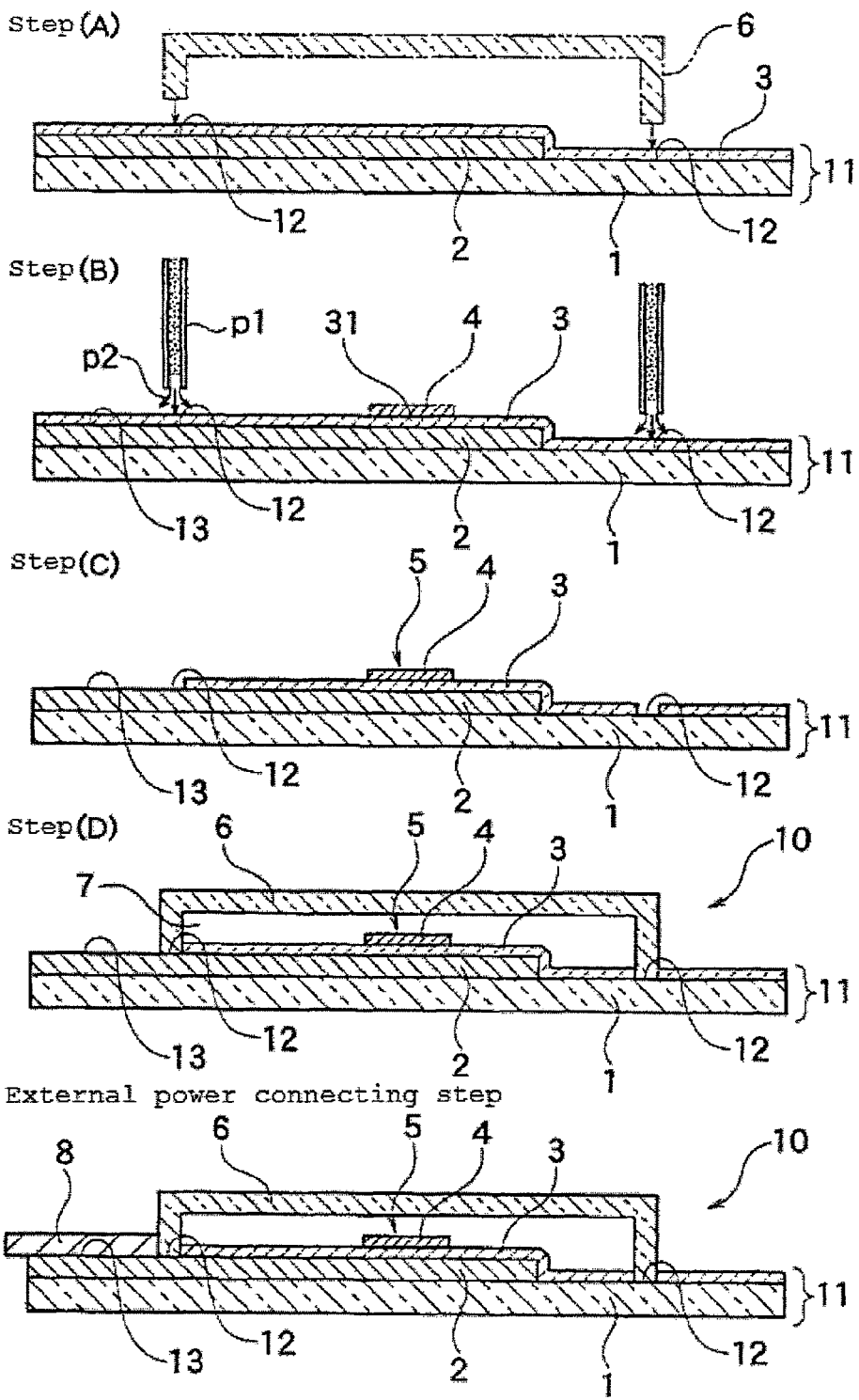

[Fig. 5]
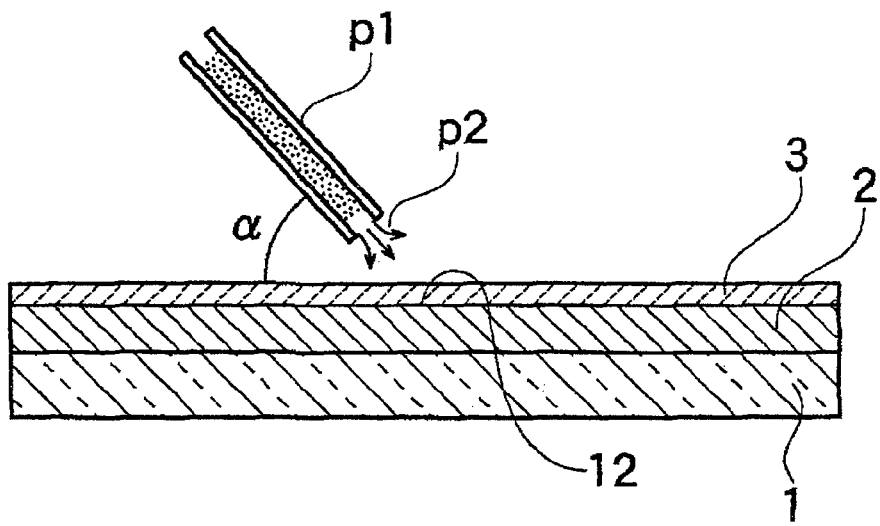
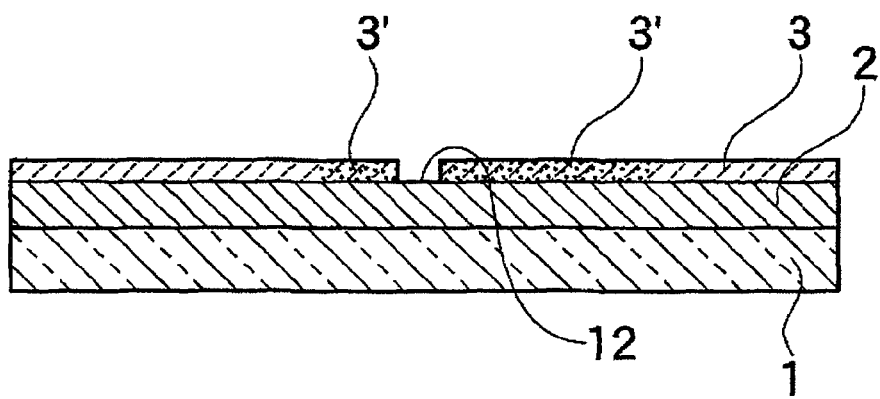

[Fig. 6]
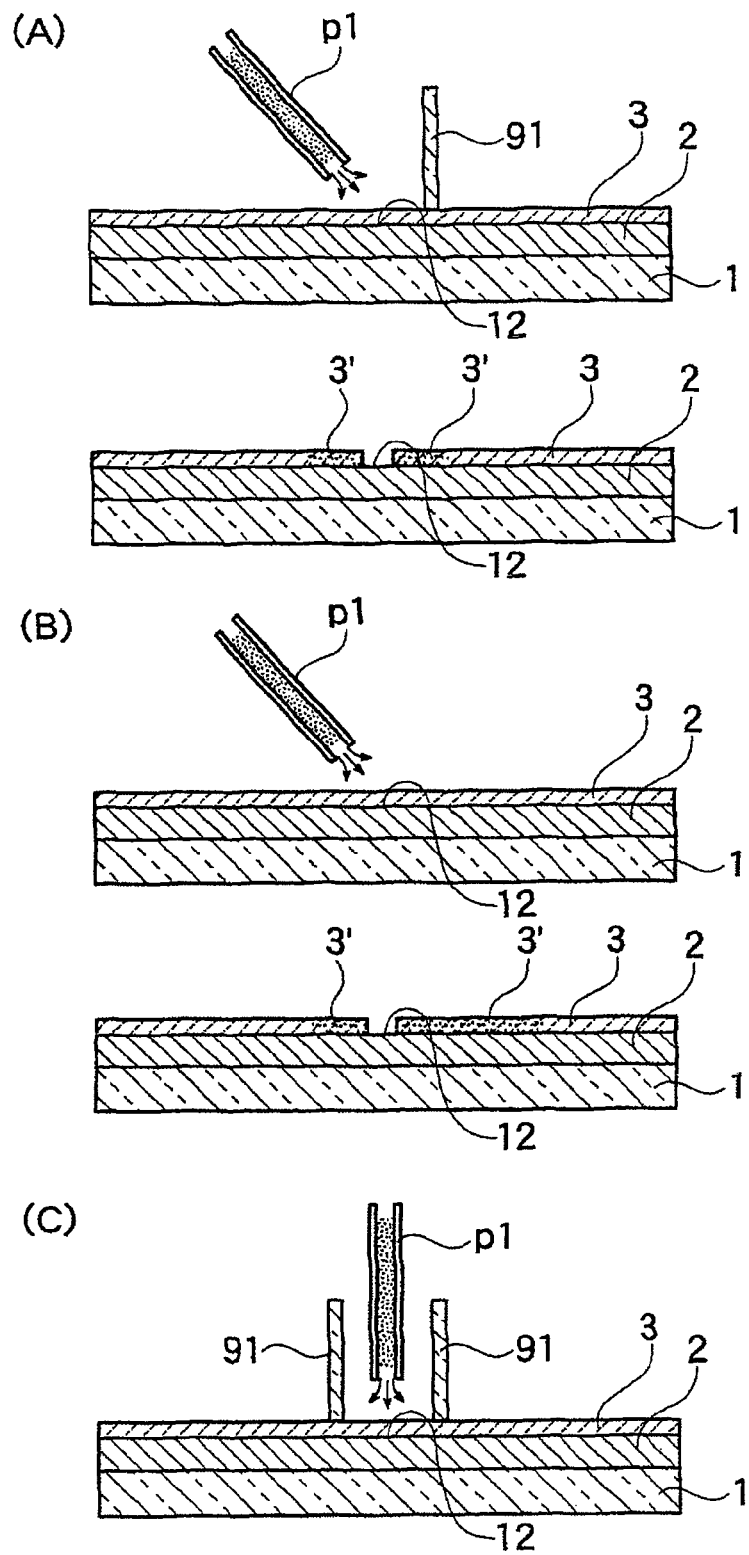

[Fig. 7]
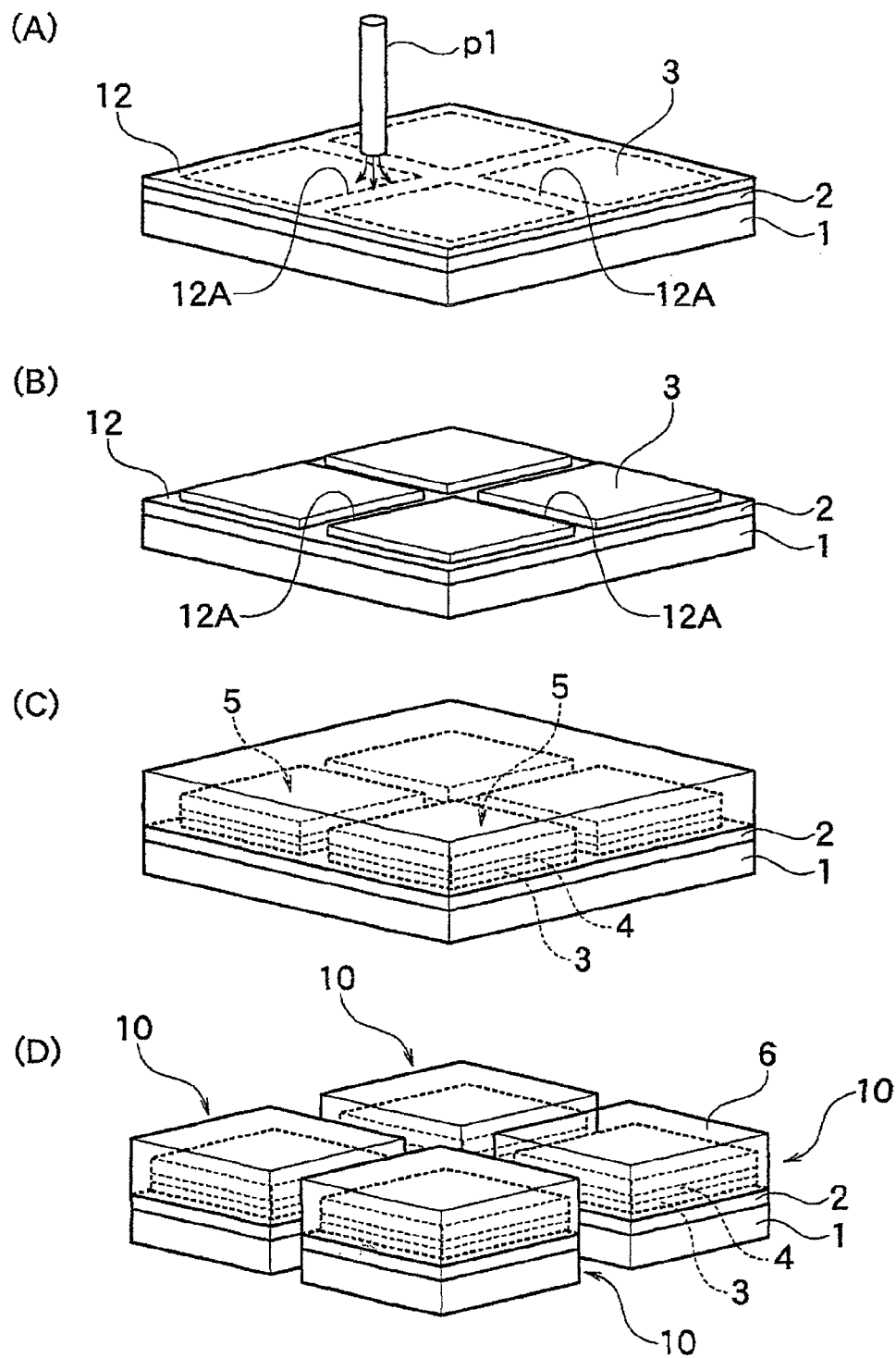

[Fig. 8]
(A)
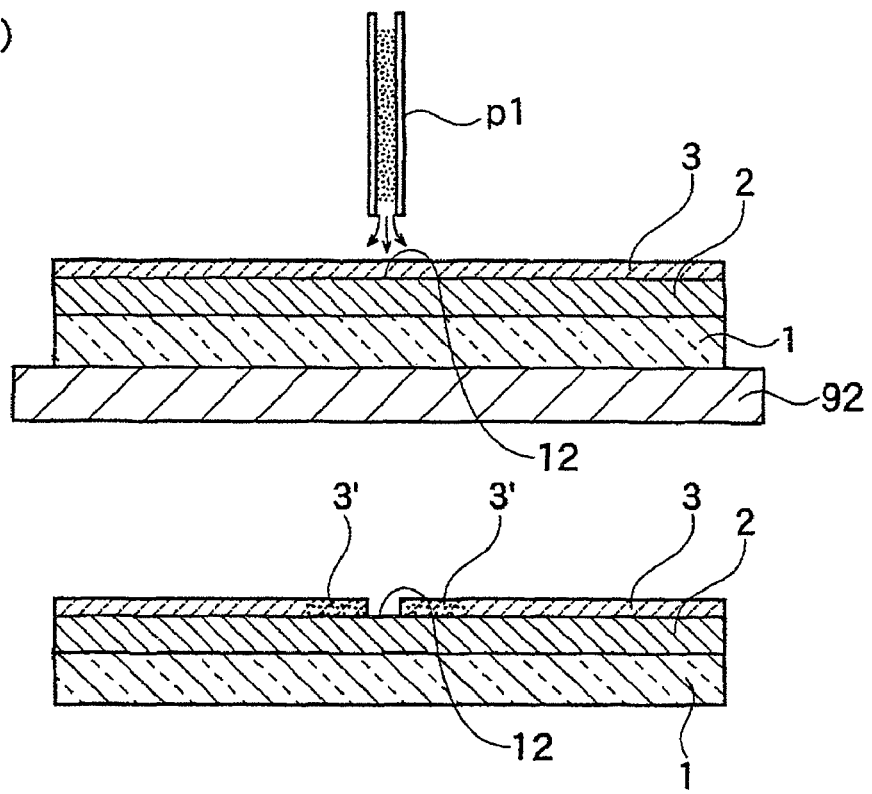
(B)
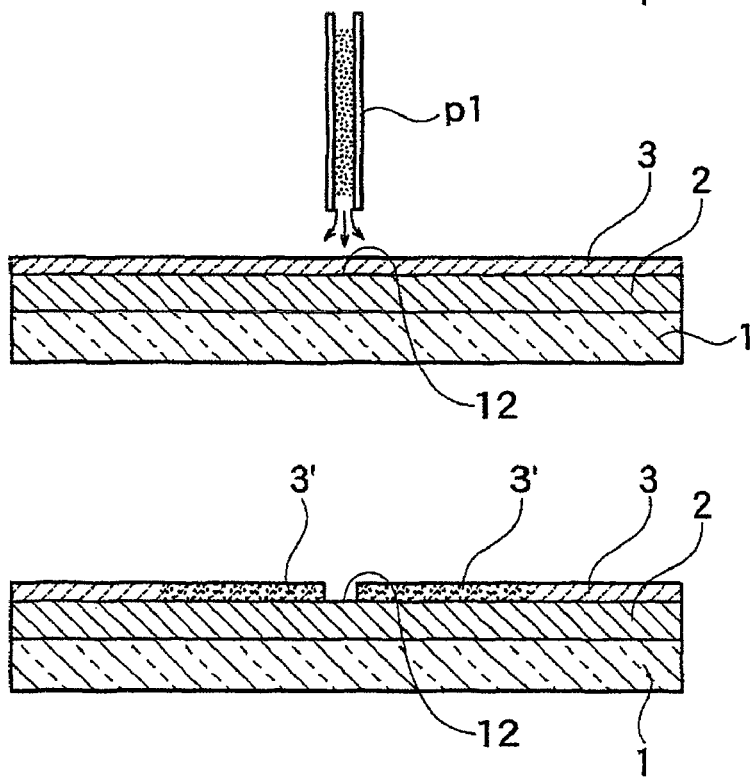

[Fig. 9]
(A)
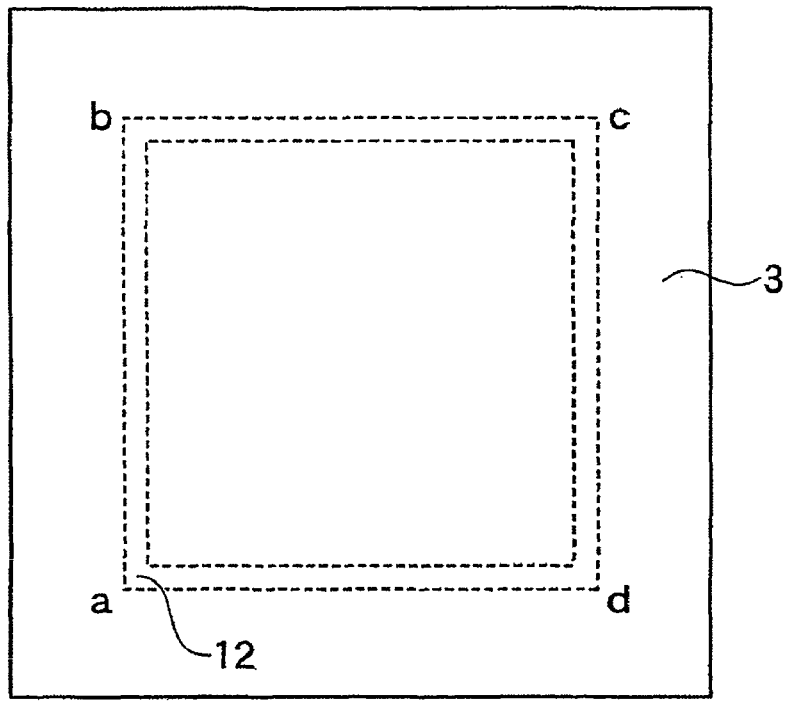
(B)
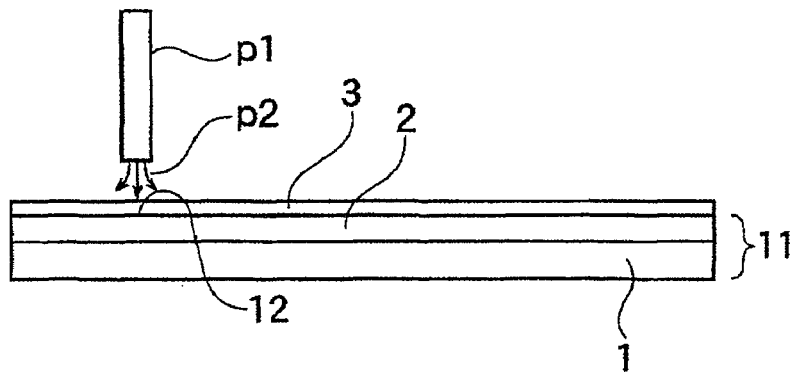
(C)
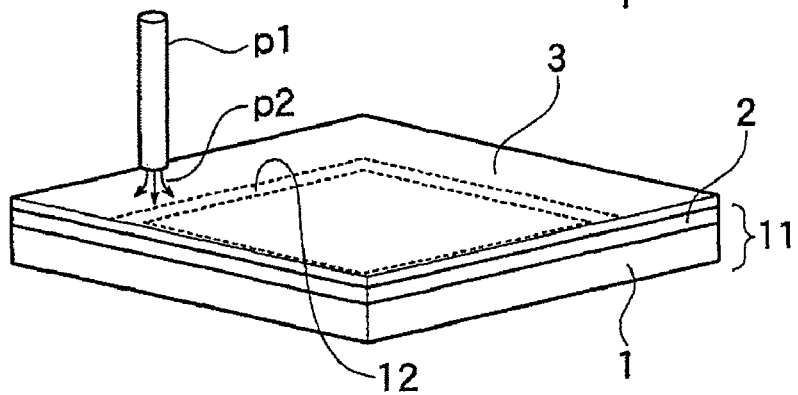

[Fig. 10]
(A)
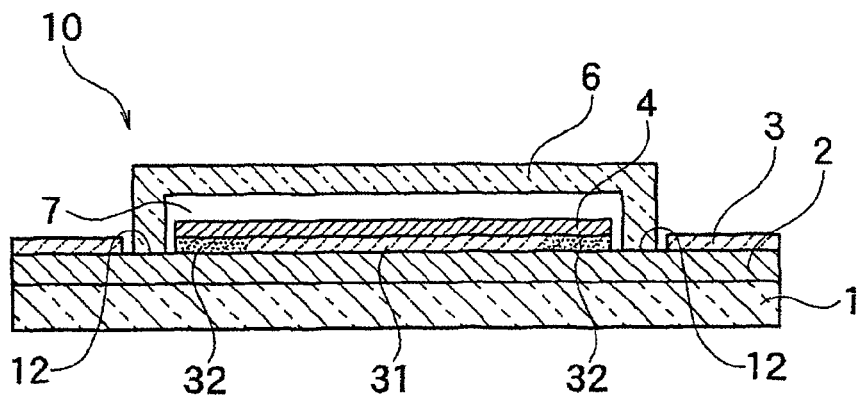
(B)
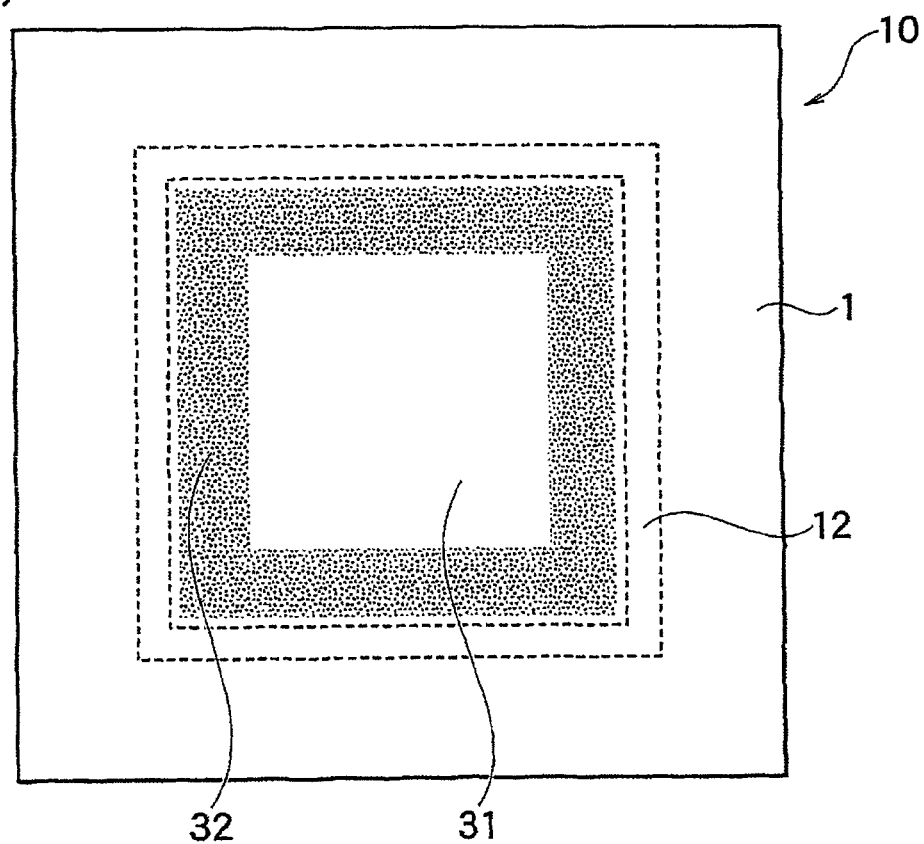

[FIG. 11]
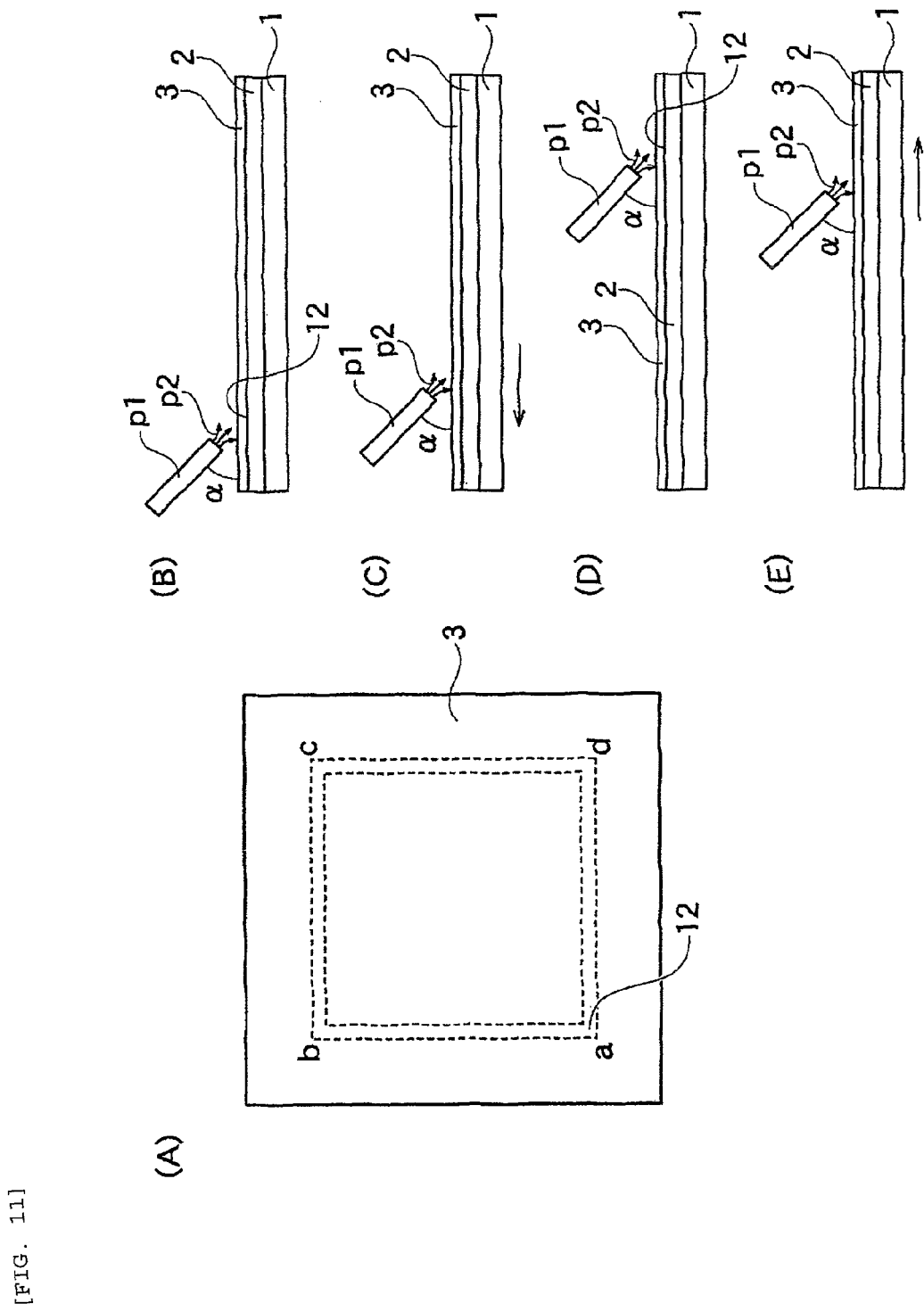

[Fig. 12]
(A)
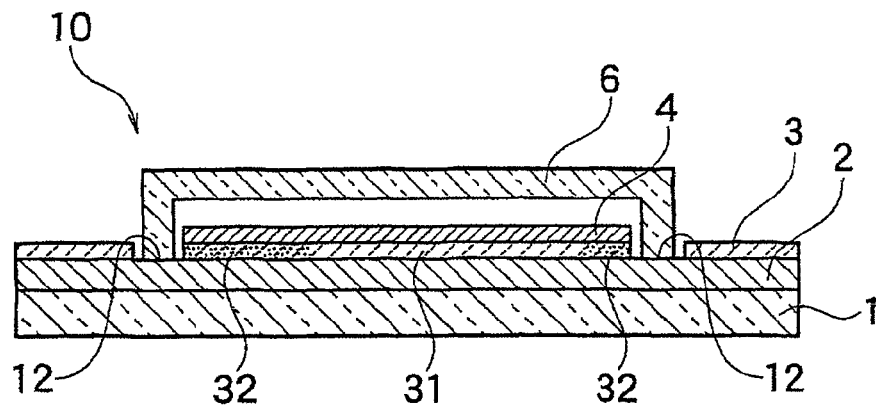
(B)
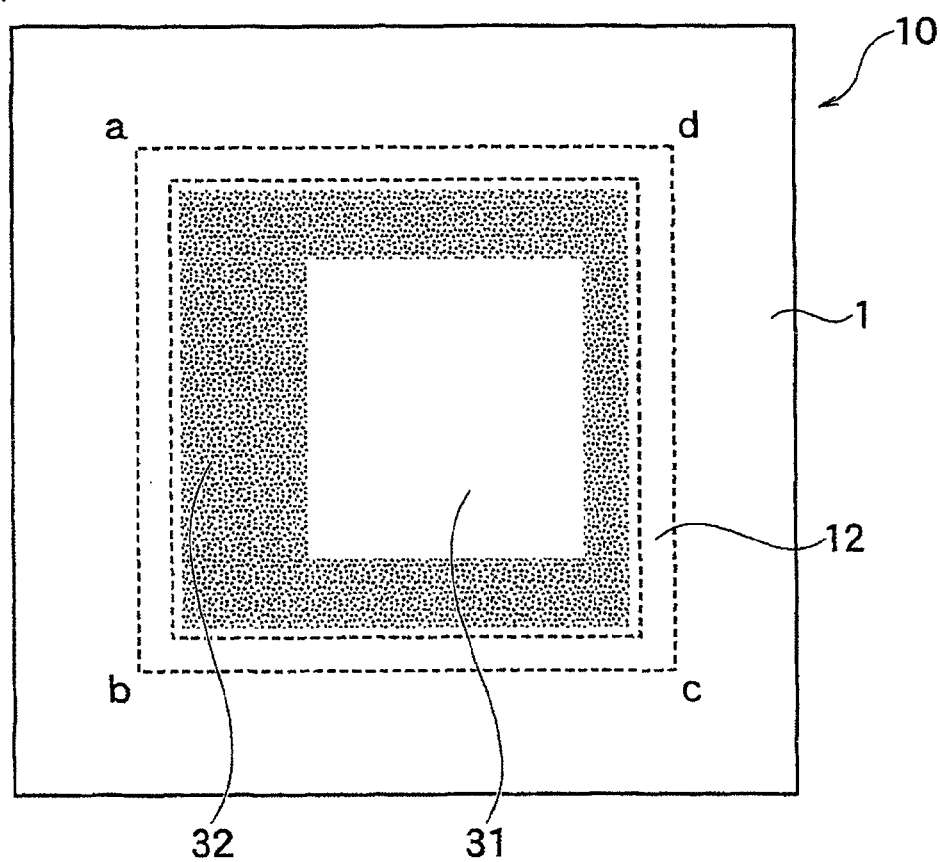

[Fig. 13]
(A)
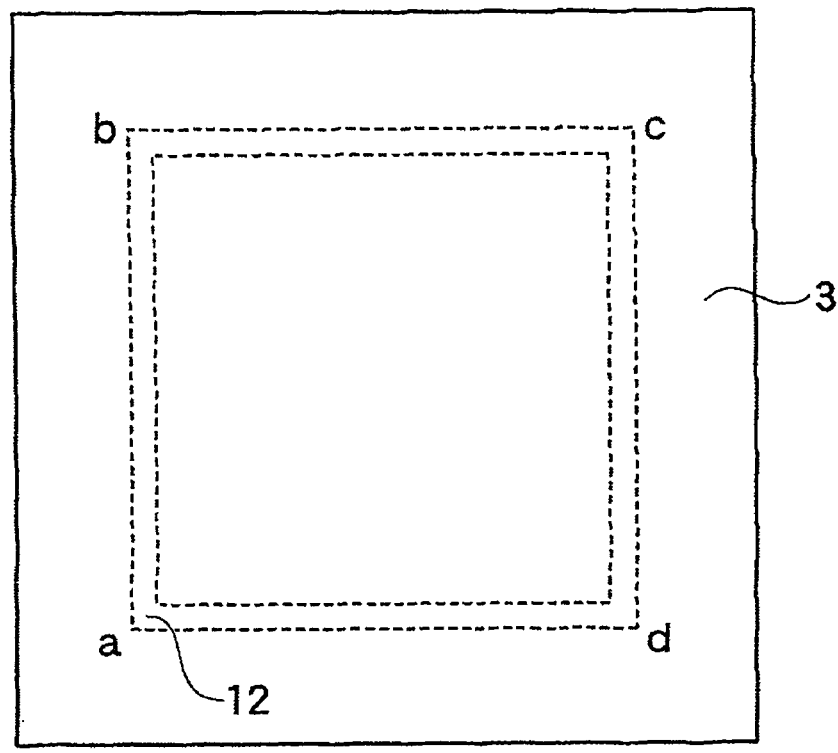
(B)
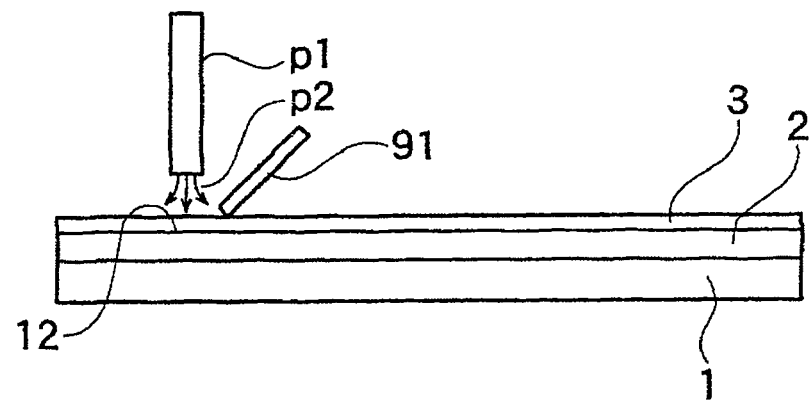

[Fig. 14]
(A)
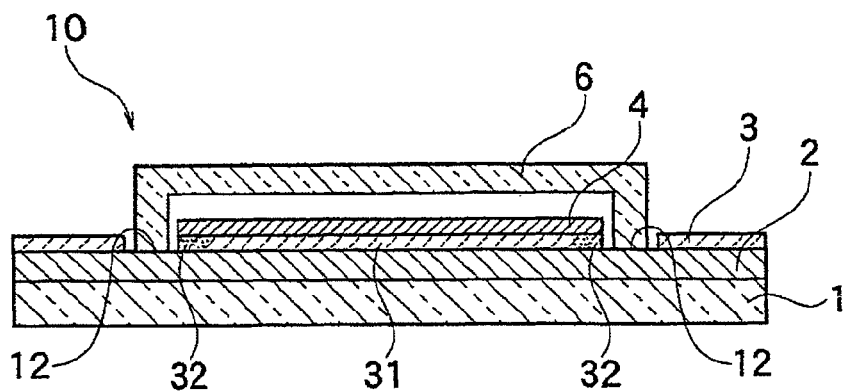
(B)
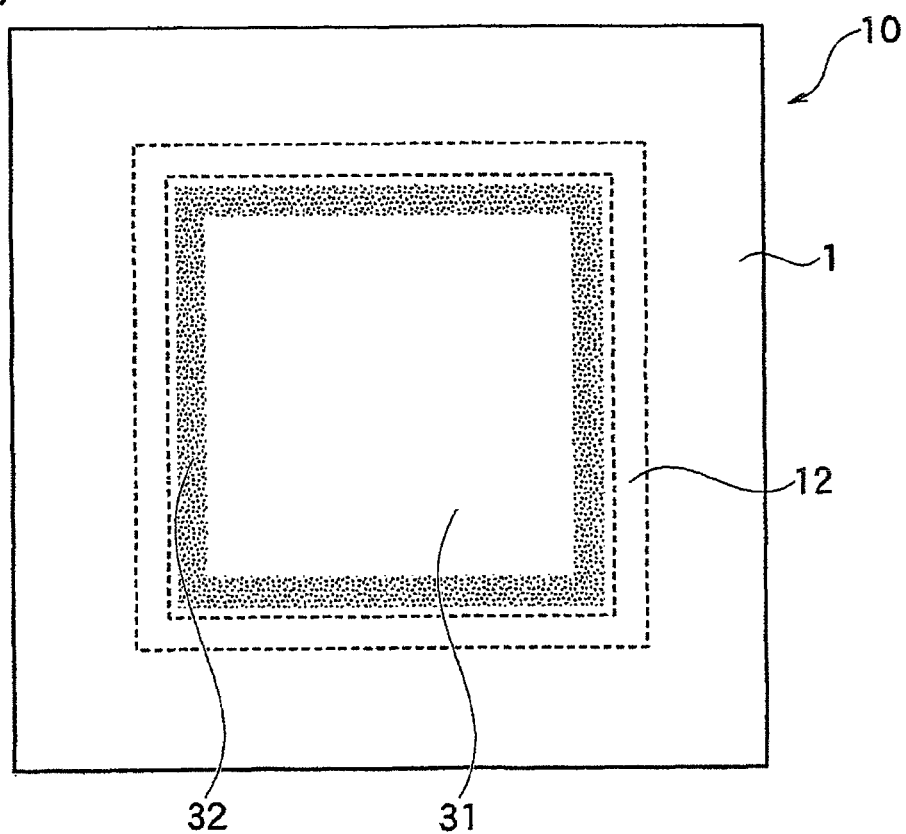

[Fig. 15]
(A)
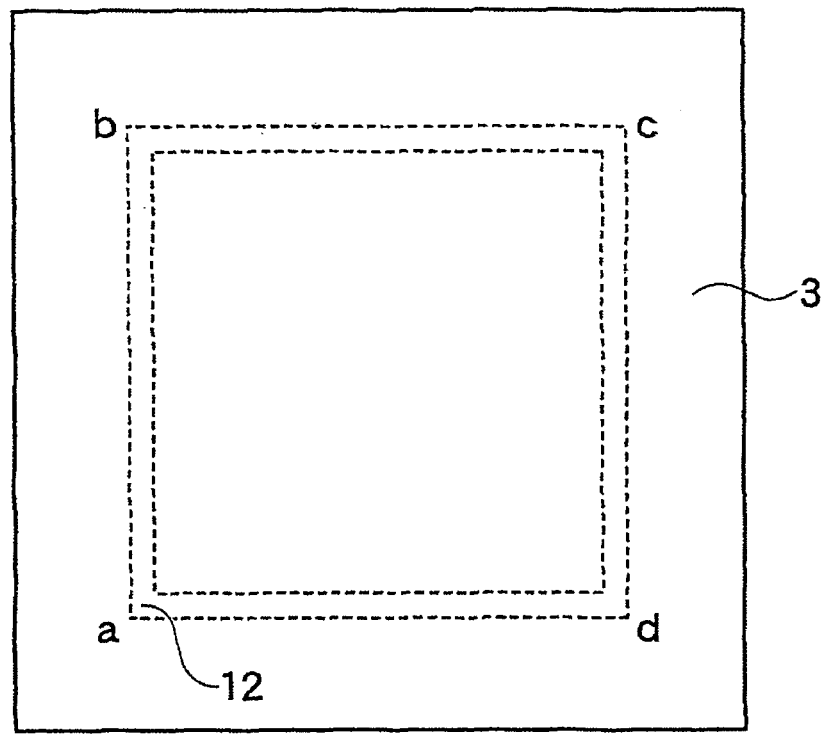
(B)
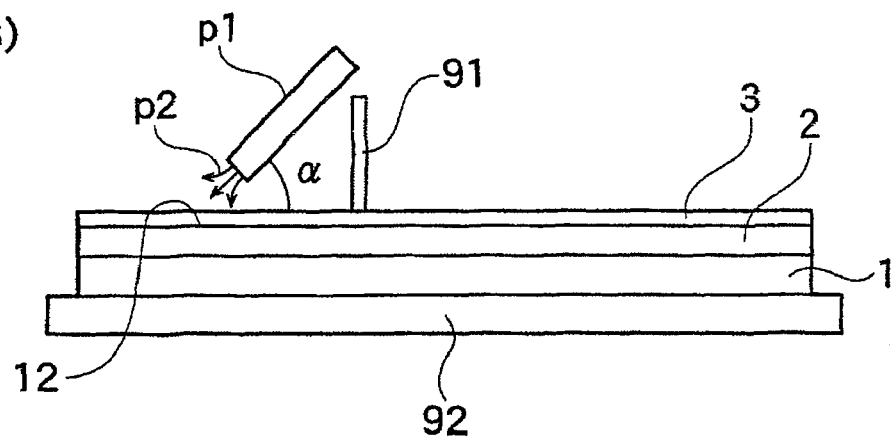

[Fig. 16]
(A)
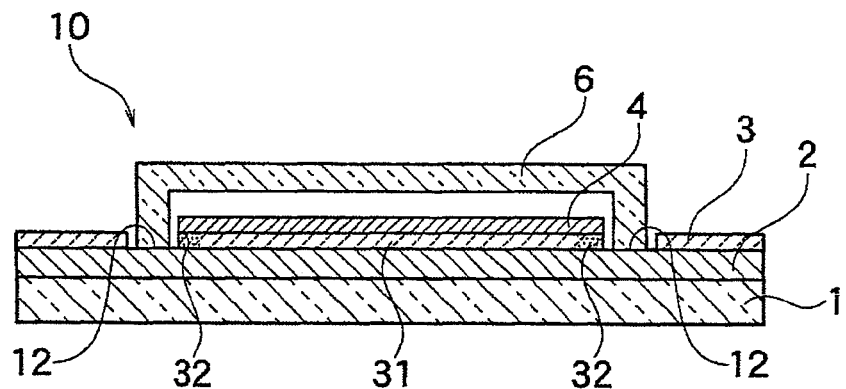
(B)
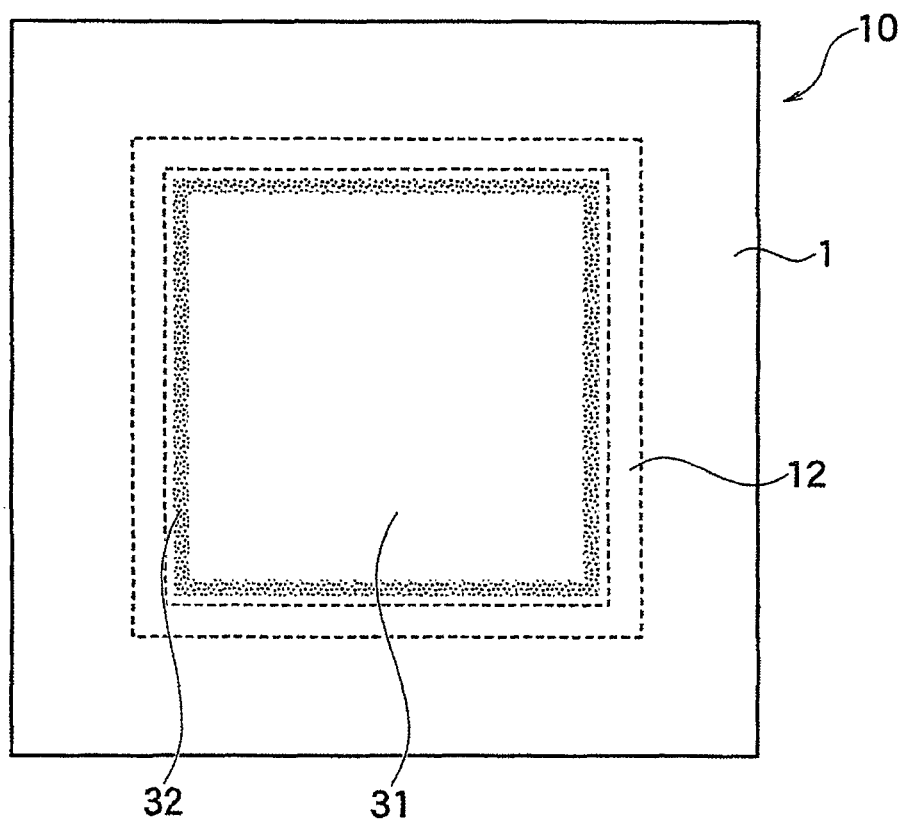

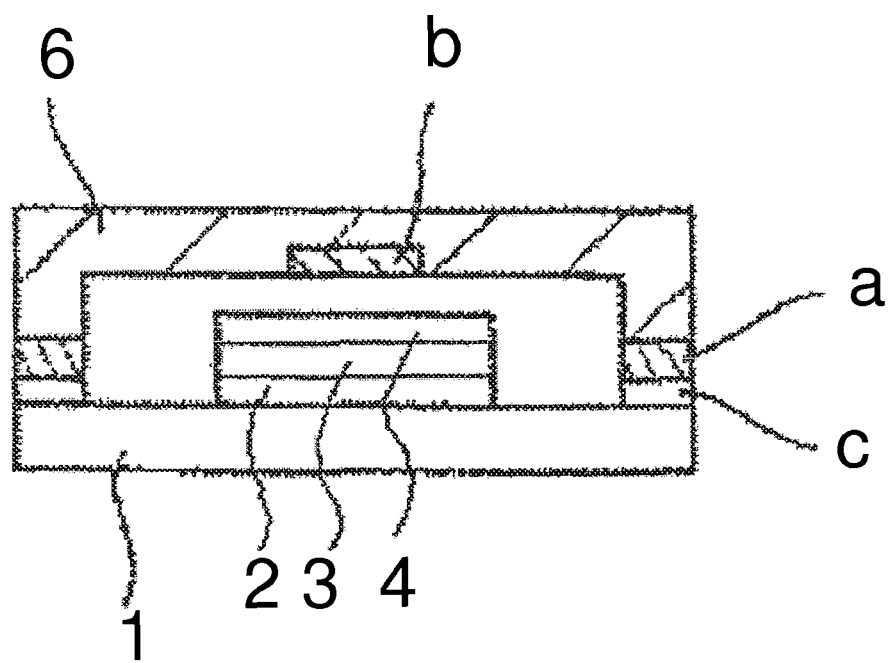
[Fig. 17]
PRIOR ART

PROCESS FOR MANUFACTURING SEALED ORGANIC ELECTROLUMINESCENCE DEVICES

TECHNICAL FIELD

The present invention relates to processes for manufacturing sealed organic electroluminescence (hereinafter, also organic EL) devices.

BACKGROUND ART

A common sealed organic EL device is illustrated in FIG. 17, in which a laminate of a transparent anode 2, an organic EL layer 3 and a cathode 4 in this order is formed on the surface of a transparent substrate 1, and a close-topped cylindrical sealing member 6 is fixed on the substrate 1 through an adhesive (a) such that it covers the laminate. The adhesive is applied to an open mouth surface of the sealing member 6. The sealed organic EL device is manufactured by sealing the laminate of the transparent anode, the organic EL layer and the cathode in between the transparent substrate 1 and the sealing member 6 through the adhesive.

However, the organic EL devices have a short life and drastically reduce emitting performances such as emission brightness and emission homogeneity from the initial levels after a duration of time. These deteriorations in emitting performances are known to be attributed to moisture formed inside the sealing member 6 or moisture that has penetrated through the adhesive (a) into the organic EL device, deteriorating the organic EL device inside the sealing member 6. To avoid this problem, a moisture absorbent (b) is provided in, for example, between the organic EL device and the sealing member 6.

Patent Literature 1 addresses the prevention of organic EL devices from deterioration by moisture formed inside a sealing member 6 or moisture that has penetrated through an adhesive (a) inside the sealing member 6. In detail, it discloses a process for sealing an organic EL device with a transparent substrate 1 and a sealing member 6, wherein the sealing is preceded by atmospheric pressure plasma treatment of mating surfaces of the transparent substrate 1 and the sealing member 6 which will be in contact together by the sealing. According to this process, the treatment for the transparent substrate 1 removes a layer (c) such as $SiO_2$ layer on the surface of the substrate 1 and roughens the treated surface by means of atmospheric pressure plasma, and the treatment for the sealing member activates and roughens the treated surface with atmospheric pressure plasma. The patent literature describes that the treated surfaces can be joined together closely and thereby the life of the organic EL devices is extended.

As described hereinabove, an organic EL device is generally sealed in such a manner that a substrate 1 and a sealing member 6 are bonded together via an adhesive (a) which has been provided in an area free of the organic EL device on the substrate 1. Accordingly, the organic EL device is not usually formed in the vicinity of the outer periphery of the substrate 1.

When an organic EL layer 3 is formed by depositing a low-molecular weight compound, the use of a deposition mask facilitates the selective formation of an organic emitting layer in a central area of a substrate 1 inside the outer periphery of the substrate 1. However, when an organic EL layer 3 is formed by applying (for example, spin coating) a high-molecular weight compound, difficulties are encountered in forming an organic emitting layer selectively in a central area of a substrate 1 while avoiding the outer periphery of the substrate 1. If an organic EL layer 3 is formed on an outer peripheral area of a substrate 1, the organic EL layer 3 found on the outer peripheral area of the substrate 1 should be removed to expose the substrate 1 in preparation for the application of an adhesive (a).

Patent Literature 2 discloses a process for producing organic EL display devices having an emitting part (an organic EL device) and a non-emitting part on a substrate. In detail, a liquid repellent part is formed between an emitting part and a non-emitting part, thereafter at least one of organic layer(s) is formed by an application method, and the organic layer formed on the non-emitting part outside the liquid repellent part is wiped away with a solvent. According to this process, an organic emitting layer formed on an outer peripheral area of a substrate 1 may be removed.

The atmospheric pressure plasma surface treatments include direct methods in which gas discharge is generated directly between an electrode and a treatment subject, and indirect methods in which excited active species are formed by discharge between a power electrode and a grounding electrode and a gas stream containing the active species is injected to the surface of a treatment subject. The indirect methods have a lower treatment rate than the direct methods and may therefore require high power. Meanwhile, the indirect methods are free from concerns about damages to the treatment subject due to the charging up or the arc discharge, and allow for local surface treatment coping with the configuration of treatment subject or limited range of treatment, by changing the shape of a nozzle injecting the gas stream or by controlling the flow rate of the gas. Such indirect plasma surface treatment methods and apparatuses used therein are disclosed in, for example, Patent Literatures 3 and 4.

Techniques to remove organic substances by plasma irradiation include plasma ashing in which an organic photoresist that has remained on a substrate after dry etching in photolithography is removed by being decomposed by plasma in a gas phase (for example, Patent Literatures 5 and 6).

CITATION LIST

Patent Literature 1: JP-A-2004-127660
Patent Literature 2: JP-A-2004-152512
Patent Literature 3: JP-A-H09-232293
Patent Literature 4: JP-A-H10-199697
Patent Literature 5: JP-A-2002-151476
Patent Literature 6: JP-A-2003-197397

SUMMARY OF INVENTION

Technical Problem

The plasma treatment of a substrate according to the process of Patent Literature 1 has problems such as:

a conductor (for example, an electrode) on the substrate disturbs the state of plasma discharge, and consequently the plasma treated surface may have nonuniform results or undesired areas may be plasma treated; and a high-pressure electrode for discharging has an area that is substantially the same as that of the substrate to be treated, and accordingly active gas species (for example, ozone) generated are in excess over a region to be attacked and consequently damage an emitting layer which should not be plasma treated.

As a result, an organic EL layer 3 that should remain can often be totally damaged.

Further, the plasma treatment in the above process is performed after a cathode is formed, and therefore the cathode is deteriorated by active gas species generated by plasma irradiation.

The wiping off of an organic layer with a solvent as described in Patent Literature 2 has problems that when organic EL devices have a plurality of organic layers, the removal operations should be repeated with solvents selected for each of the organic layers and further that when organic EL devices have layers that are insoluble in solvents (for example, anode buffer layers such as carbon fluoride layers), such layers cannot be removed.

Further, the process involves the formation of a liquid repellent part which is not normally necessary in organic EL devices between an emitting part and a non-emitting part, thereby complicating the process steps.

The present invention has been made in consideration of the background art as described above. It is therefore an object of the present invention that a technique in processes for manufacturing organic EL devices is provided which allows for easy partial removal of an organic EL layer to expose a portion of a substrate with selectivity while preventing damages to the organic EL layer that forms an emitting part.

Solution to Problem

The present inventors studied diligently to solve the problems described hereinabove and have completed the present invention. For example, the present invention is concerned with the following [1] to [5].

[1] A process for manufacturing sealed organic electroluminescence devices,
the sealed organic electroluminescence device comprising:
a substrate,
a sealing member bonded to the substrate, the sealing member having an opening on the side bonded with the substrate, and
an organic electroluminescence device formed on the substrate, the device being accommodated in a closed space defined by the substrate and the sealing member, the device comprising an anode, an organic electroluminescence layer including at least one emitting layer, and a cathode;
the process comprising:
a step (A) of forming the organic electroluminescence layer on a region of an anode-mounted substrate comprising the substrate and the anode, the region including at least a bonding region in which the sealing member will be bonded and a region which is found inward the bonding region,
a step (B) of removing a portion of the organic electroluminescence layer which is found at least on the bonding region by applying plasma by a remote plasma method to expose the bonding region,
a step (C) of forming the cathode on the organic electroluminescence layer to complete the organic electroluminescence device, and
a step (D) of bonding the sealing member to the exposed bonding region.

[2] The process for manufacturing sealed organic electroluminescence devices described in [1], wherein the anode-mounted substrate further comprises an anode buffer layer formed on the anode.

[3] The process for manufacturing sealed organic electroluminescence devices described in [2], wherein the anode buffer layer comprises carbon fluoride.

[4] The process for manufacturing sealed organic electroluminescence devices described in anyone of [1] to [3], wherein the organic electroluminescence layer is formed by an application method.

[5] The process for manufacturing sealed organic electroluminescence devices described in any one of [1] to [4], wherein the step (A) is a step of forming the organic electroluminescence layer on a region of the anode-mounted substrate, the region including at least a bonding region in which the sealing member will be bonded, a region which is found inward the bonding region, and an external power connecting region on the anode which will be connected with an external power, and
the step (B) is a step of removing a portion of the organic electroluminescence layer which is found at least on the bonding region and on the external power connecting region by applying plasma by a remote plasma method to expose the bonding region and the external power connecting region.

Advantageous Effects of Invention

The processes for manufacturing sealed organic EL devices of the present invention allow for easy partial removal of an organic EL layer to expose a portion of a substrate with selectivity while preventing damages to the organic EL layer which forms an emitting part.

BRIEF DESCRIPTION OF DRAWINGS

FIG. 1 is a schematic sectional view of a sealed organic EL device.

FIG. 2 shows an embodiment of the processes for manufacturing sealed organic EL devices according to the invention.

FIG. 3 is a schematic sectional view of an embodiment of an anode-mounted substrate having an anode buffer layer and an organic EL layer.

FIG. 4 shows an embodiment of the processes for manufacturing sealed organic EL devices according to the invention.

FIG. 5 is a set of schematic sectional views showing a relation of plasma irradiation mode and damaged region 3'.

FIG. 6 is a set of schematic sectional views showing relations of plasma irradiation mode and damaged region 3'.

FIG. 7 shows an embodiment of the processes for manufacturing sealed organic EL devices according to the invention.

FIG. 8 is a set of schematic sectional views showing relations of plasma irradiation mode and damaged region 3'.

FIG. 9(A) is a schematic plane view of an emitting layer-mounted substrate used in Example 1, FIG. 9(B) is a schematic view showing a mode of plasma irradiation to the emitting layer-mounted substrate, and FIG. 9(C) is a schematic perspective view showing the mode of plasma irradiation to the emitting layer-mounted substrate.

FIG. 10(A) is a schematic sectional view of a sealed organic EL device manufactured in Example 1, and FIG. 10(B) is a schematic plane view of the sealed organic EL device seen from the emitting surface side.

FIG. 11(A) is a schematic plane view of an emitting layer-mounted substrate used in Example 2, and FIGS. 11(B) to (E) are views showing a mode of plasma irradiation to the emitting layer-mounted substrate.

FIG. 12(A) is a schematic sectional view of a sealed organic EL device manufactured in Example 2, and FIG. 12(B) is a schematic plane view of the sealed organic EL device seen from the emitting surface side.

FIG. 13(A) is a schematic plane view of an emitting layer-mounted substrate used in Example 4, and FIG. 13(B) is a view showing a mode of plasma irradiation to the emitting layer-mounted substrate.

FIG. 14(A) is a schematic sectional view of a sealed organic EL device manufactured in Example 4, and FIG. 14(B) is a schematic plane view of the sealed organic EL device seen from the emitting surface side.

FIG. 15(A) is a schematic plane view of an emitting layer-mounted substrate used in Example 5, and FIG. 15(B) is a view showing a mode of plasma irradiation to the emitting layer-mounted substrate.

FIG. 16(A) is a schematic sectional view of a sealed organic EL device manufactured in Example 5, and FIG. 16(B) is a schematic plane view of the sealed organic EL device seen from the emitting surface side.

FIG. 17 is a schematic sectional view of a conventional sealed organic EL device.

DESCRIPTION OF EMBODIMENTS

The processes for manufacturing sealed organic EL devices of the invention will be described hereinbelow with reference to the drawings.

Sealed Organic EL Devices

FIG. 1 is a sectional view which illustrates an embodiment of the constitution of a sealed organic EL device 10 manufactured by the process of the invention. The sealed organic EL device 10 includes a substrate 1, a sealing member 6 which is bonded to the substrate 1 and has an opening on the substrate 1 side, and an organic EL device 5 formed on the substrate 1 and accommodated in a closed space 7 defined by the substrate 1 and the sealing member 6, the device including an anode 2, an organic EL layer 3 including at least one emitting layer, and a cathode 4.

In the specification, the direction extending from the substrate 1 toward the anode 2 is defined to be an "upward" direction for convenience.

<A. Device Constitution>

The organic EL devices 5 may be constituted with the anode 2, the cathode 4 and, between these electrodes, layers including the organic EL layer 3 such as: 1) emitting layer/electron transporting layer, 2) anode buffer layer/emitting layer, 3) anode buffer layer/emitting layer/electron transporting layer, 4) anode buffer layer/hole transporting layer/emitting layer/electron transporting layer, 5) anode buffer layer/emitting layer containing a hole transporting compound, an emitting compound and an electron transporting compound, 6) anode buffer layer/emitting layer containing a hole transporting compound and an emitting compound, 7) anode buffer layer/emitting layer containing an emitting compound and an electron transporting compound, 8) anode buffer layer/emitting layer containing a hole transporting and electron transporting compound and an emitting compound, or 9) anode buffer layer/emitting layer/hole blocking layer/electron transporting layer. The devices may have a single or two or more emitting layers.

Unless otherwise specified, compounds of all or one or more compounds of electron transporting compounds, hole transporting compounds and emitting compounds will be referred to as the organic EL compounds, and layers containing such compounds will be referred to as the organic EL compound layers.

<B. Substrates>

The substrates 1 may be insulating substrates that are transparent at emission wavelength of the emitting compounds. Examples thereof include known flexible materials such as glass and transparent plastics including PET (polyethylene terephthalate) and polycarbonate. When the substrate is quadrangular, the length of the sides may be about 20 to 2000 mm, and preferably about 100 to 1000 mm.

<C. Anodes>

The anodes 2 may be most commonly conductive, optically transparent layers represented by metal oxides such as indium tin oxide (ITO) and indium zinc oxide (IZO). In the case where the organic light emission is obtained through the substrate, the anode and the substrate should be light transmissive. In the case of top emission in which the organic light emission is obtained through the upper electrode, the anode does not need to be light transmissive and may be formed of any appropriate material such as a metal or a metal compound having a work function of more than 4.1 eV.

For example, gold, nickel, manganese, iridium, molybdenum, palladium and platinum may be used singly or in combination. Alternatively, the anode may be selected from metal oxides, metal nitrides, metal selenides and metal sulfides. Still alternatively, the anode may be one in which the above metal is spread on the surface of ITO having high light transmittance to form a thin layer 1 to 3 nm in thickness without deteriorating the light transmittance. Such layers may be formed on the surface of anode materials by methods such as electron beam deposition, sputtering, chemical reaction, coating and vacuum deposition. The thickness of the anodes is preferably in the range of 2 to 300 nm.

An embodiment will be described below in which the anode 2 is ITO.

An ITO layer formed on a glass substrate 1 is patterned to an electrode with desired shape by photolithography technique. A plurality of ITO electrodes 2 are created with desired shape on the surface of the glass substrate.

<D. Anode Surface Treatments and Anode Buffer Layers>

The surface of the anodes 2 may be treated (surface treated) to improve performances of layers that will be overcoated thereon (e.g., adhesion with the anode substrate, surface smoothness, lowered hole injection barrier). Such treatments include high frequency plasma treatment, sputtering, corona treatment, UV ozone irradiation treatment and oxygen plasma treatment.

In the treatment, the use of a mask or the like allows for selective local treatment on the surface of the anodes 2 without the exposed areas of the substrate 1 (areas where the anodes 2 are not formed) being treated.

Anode buffer layers 21 may be formed by the surface treatment. The thickness thereof is preferably 0.2 to 30 nm, and more preferably 0.2 to 10 nm. Properties required after the formation of the anode buffer layers include that the layers are not redissolved by application of compounds laminated on the anode buffer layers (hereinafter, also the organic EL compounds), that the layers are not scattered or diffused by physical impact during the application step, that the layers have good adhesion with the emitting compounds, and that the layers have appropriate ionization potential.

Suitable examples of the compounds showing good adhesion with the organic EL compounds include compounds that have a partial structure having a strong interaction with the organic EL compounds. The partial structures may be suitably structures which potentially provide a hydrophobic interaction such as structures appropriately containing an aromatic ring, an alkyl chain, fluorine and the like. The appropriate ionization potential may vary depending on the organic EL compounds used, but is preferably 4.5 to 6.0 eV, and more preferably 4.8 to 5.5 eV.

The anode buffer layers 21 may be formed by applying a solution of a water repellent compound such as fluoroalkylsilane, or by dry processes such as radio frequency (RF) plasma treatment. In particular, layers having excellent adhesion and high durability may be obtained by radio frequency plasma treatment in which glow discharge is applied to an organic gas to cause the organic gas to deposit as solid on a solid layer. For example, gaseous fluorocarbon may be glow-discharged in RF plasma and brought into contact with the substrate to form anode buffer layers of fluorocarbon (hereinafter, also the carbon fluoride thin layers) on the substrate. The gaseous fluorocarbon may be selected from $CF_4$, $C_3F_8$, $C_4F_{10}$, $CHF_3$, $C_2F_4$ and $C_4F_8$. The carbon fluoride thin layers have water repellency.

Because it is difficult to bond a sealing member or connect an external power to the carbon fluoride thin layer, the carbon fluoride thin layer found in areas where sealing members will be bonded or external powers will be connected is preferably removed.

Plasma is generated by applying (outputting) a radio frequency (RF) voltage to a treatment apparatus at an appropriate power level. The reaction temperature may vary depending on parameters such as power output, gas flow rate and treatment time, and a temperature regulator is preferably provided in the apparatus to control the layer thickness with good reproducibility. In an anode-mounted glass substrate 11 in which the thin layers, in particular carbon fluoride thin layers are formed on the surface as described above, the contact angle on the substrate surface varies from 30° to 170°. This contact angle is associated with luminous efficiency and durability of organic EL devices. To achieve excellence in these properties, the contact angle is preferably in the range of 40° to 150°, and more preferably 60° to 120°.

The anode buffer layers may be prepared by wet processes such as spin coating, casting, microgravure coating, gravure coating, bar coating, roll coating, wire bar coating, dip coating, spray coating, screen printing, flexographic printing, offset printing and inkjet printing.

The compounds used for the layer production by the wet processes are not particularly limited as long as the compounds show good adhesion to the anode surface and the organic EL compounds contained in the layers over the anode buffer layers. It is more preferable to use conventional anode buffers. Examples thereof include conductive polymers such as PEDOT-PSS which is a mixture of poly(3,4)-ethylenedioxythiophene and polystyrenesulfonate and PANI which is a mixture of polyaniline and polystyrenesulfonate. Organic solvents such as toluene and isopropyl alcohol may be added to the conductive polymers. Further, the conductive polymers may contain a third component such as surfactant. The surfactants used herein may contain a group selected from alkyl groups, alkylaryl groups, fluoroalkyl groups, alkylsiloxane groups, sulfates, sulfonates, carboxylates, amides, betaine structures and quaternary ammonium groups. Fluoride-based nonionic surfactants may also be used.

(Surface Treatment Methods (α))

The surface of the anodes 2 may be treated, for example, by the following methods (α1) to (α11).

(α1) A method of surface treating the anodes 2 comprising a contact step of bringing the anodes 2 into contact with an alkaline solution of a compound having a Si—O bond.

(α2) The method of surface treating the anodes 2 as described in [s1], wherein the compound having a Si—O bond is a silicate.

(α3) The method of surface treating the anodes 2 as described in (α2), wherein the silicate is at least one selected from sodium silicate, potassium silicate, rubidium silicate and lithium silicate.

(α4) The method of surface treating the anodes 2 as described in any one of (α1) to (α3), wherein the alkaline solution contains the compound having a Si—O bond at 0.001 to 15% by mass in terms of Si atoms.

(α5) The method of surface treating the anodes 2 as described in any one of (α1) to (α4), wherein the alkaline solution contains an alkali metal ion and the molarity of the alkali metal ion in the alkaline solution is 0.1 to 10 times the molarity in terms of Si atoms of the compound having a Si—O bond.

(α6) The method of surface treating the anodes 2 as described in any one of (α1) to (α5), wherein the contact step is performed by soaking the anodes 2 in the alkaline solution.

(α7) The method of surface treating the anodes 2 as described in any one of (α1) to (α5), wherein the contact step is performed by spraying the alkaline solution to the anodes 2.

(α8) The method of surface treating the anodes 2 as described in any one of (α1) to (α7), which further comprises a washing step of washing the anodes 2 with water after the contact step.

(α9) The method of surface treating the anodes 2 as described in (α8), wherein the washing step is performed by at least one of brush washing, two-fluid washing, ultrasonic washing and high-pressure jet washing.

(α10) The method of surface treating the anodes 2 as described in any one of (α1) to (α9), which further comprises a heating step of heating the anodes 2 to 60 to 250° C. at a stage after the washing step.

(α11) The method of surface treating the anodes 2 as described in any one of (α1) to (α10), which further comprises a UV irradiation step of irradiating the anodes 2 with UV rays at a stage after the washing step.

According to the surface treatment methods for the anodes 2 (hereinafter, also the surface treatment methods (α)), the work function of the anodes 2 such as ITO may be increased easily.

Through the surface treatment method (α) for the anodes 2, sealed organic EL devices 10 having high work function anodes 2 may be manufactured easily.

Further, the surface treatment methods (α) for the anodes 2 improve emission properties (luminous efficiency, life) of the sealed organic EL devices 10.

The anodes 2 that are surface treated by the surface treatment method (α) for the anodes 2 increase wettability with a solution for forming an emitting layer. Accordingly, homogeneous and highly smooth emitting layers may be obtained in particular when the emitting layers are formed by an application method. As a result, the obtainable sealed organic EL devices 10 have a quality emitting surface without uneven brightness or defects and have no leakage current.

<Contact Step>

The surface treatment method (α) includes a contact step of bringing the anodes 2 (usually anode-mounted substrate 11) into contact with an alkaline solution of a compound having a Si—O bond.

The compounds having a Si—O bond are preferably silicates. In a more preferred embodiment, at least one silicate (alkali metal silicate) is selected from the group consisting of sodium silicate, potassium silicate, rubidium silicate and lithium silicate. The alkaline solutions of these compounds are stable at and around normal temperature.

The silicates may be orthosilicates, metasilicates and polysilicates.

Preferred silicates are composed of chain silicate ions and alkali metal ions. Although variable depending on the molecular weight of the silicate ions, the alkaline solutions of such silicates do not gel and will have a viscosity (about 0.1 to 100 cPs) such that good handling properties are obtained in the contact step.

Preferred solvents for the solution are compounds having a hydroxyl group, and water. Alcohols and water are more preferable, and water is particularly preferable. The solvents may be used singly, or two or more kinds may be used in combination. When the compound having a Si—O bond is a silicate, the silicate ions and the cations such as alkali metal ions are solvated by the above compounds as the solvents. The solvation keeps the silicate ions away from one another, giving a homogeneous solution.

The solution is preferably a solution of a silicate, more preferably an aqueous solution of the alkali metal silicate, and particularly preferably a diluted aqueous solution of liquid glass. These solutions, particularly aqueous solutions, keep the silicate ions away from one another as described above. According to Pearson's hard soft acid base principle, the alkali metal ions are hard acids and water is hard base. Therefore, when the solution contains alkali metal ions and water, the alkali metal ions are strongly solvated (hydrated) and consequently the silicate ions can exist stably in the solution.

The solutions are alkaline with a pH generally in the range of 9 to 14, and preferably 10 to 13 at room temperature (25° C.) If the pH is excessively high, the anodes 2 may be corroded (dissolved). With an excessively low pH, the solution may be gelled and, because the concentration of ions derived from the Si—O bond-having compounds such as silicate ions is low, the level of contact treatment may vary during the contact treatment step and the contact treatment step may result in unstable results.

When the alkaline solution is allowed to stand in the air at normal temperature and normal pressure, carbon dioxide in the air is dissolved in the alkaline solution. As a result, the pH of the alkaline solution gradually decreases, although the decrease takes place very slowly. To prevent this, the solution is preferably placed in a highly airtight container to eliminate any contact with air when the alkaline solution is stored for a long term.

In the alkaline solutions, the concentration of the compounds having a Si—O bond (or the concentration of silicate ions derived from the compounds) is usually not more than 20% by mass in terms of Si atoms, preferably in the range of 0.001 to 15% by mass, more preferably 0.01 to 3% by mass, and still more preferably 0.05 to 1% by mass. When the concentration is high, the contact step may be completed in a short time. When the concentration is low, the contact step may be reproduced and controlled easily and the contact step takes place stably. On the other hand, if the concentration is in excess of the above range, it is often difficult to reproduce or control the contact step and to remove the solution from the surface of the anodes 2 after the completion of the contact step. If the concentration is below the above range, the contact step may take a long time or the contact treatment step may be unstable because the change in concentration of the solution during the contact treatment step has greater influences on the level of contact treatment.

In the alkaline solutions, the concentration of the alkali metal ions is preferably 0.1 to 10 times, and more preferably 0.25 to 2 times the concentration of the compounds having a Si—O bond (or the concentration of ions released therefrom such as silicate ions) in terms of Si atoms. The alkali metal ions in this concentration allow the counterions, i.e., the silicate ions, to exist stably in the solution.

The solutions preferably have a viscosity (about 0.1 to 100 cPs) such that the anodes 2 can be soaked in the solutions or the solutions can be sprayed to the anodes 2.

The alkaline solutions may further contain a surfactant. The surfactants lower the surface tension of the alkaline solutions, and the alkaline solutions can wet the anodes 2 more easily, thereby achieving more uniform contact treatment.

In detail, a nonionic surfactant and/or a carboxylic acid surfactant may be used as the surfactant.

Examples of the nonionic surfactants include polyoxyethylene alkyl phenyl ethers, polyoxyethylene alkyl ethers and acyl glycerols. Examples of the carboxylic acid surfactants include aliphatic monocarboxylates (fatty acid soaps) and alkanoyl sarcosines.

The surfactants may be used singly, or two or more kinds may be used in combination.

The contact step is preferably performed by soaking the anodes 2 or the anode-mounted substrate 11 in the solution, or by spraying the solution to the anodes 2 or the anode-mounted substrate 11. The contact step by these methods can treat the entire surface of the anodes 2 or the anode-mounted substrate 11 uniformly at one time.

When the contact step is performed by soaking the anodes 2 or the anode-mounted substrate 11 in the solution, the reproducibility of the surface treatment for the anodes 2 may be enhanced by controlling the concentration and temperature of the alkaline solutions, the soaking time, and the operation of a stirring apparatus.

In order to treat the surface of the anodes 2 even more uniformly in the contact step performed by soaking, the contact step preferably involves swaying the anodes 2, stirring the solution or ultrasonicating the solution during the soaking.

When the contact step is performed by spraying the solution to the anodes 2 or the anode-mounted substrate 11, an embodiment may be adopted wherein a member from which the solution is sprayed is fixed and the anodes 2 or the anode-mounted substrate 11 is moved relative to the member while the solution is sprayed thereto. According to this embodiment, the anodes 2 or the anode-mounted substrates 11 may be treated continuously, and even anode-mounted substrates 11 having a large size may be treated easily.

In order to treat the surface of the anodes 2 even more uniformly in the contact step performed by spraying, the contact step is preferably carried out by spraying the solution over the entire surface of the anodes 2, by spraying the solution using an ultrasonic nozzle, by spraying the solution using a two-fluid nozzle, or by spraying the solution using a high-pressure nozzle.

The solution preferably has a temperature of 10 to 90° C., and more preferably 25 to 60° C. If the temperature is in excess of this range, the contact step may be completed in so short a time that it is often difficult to reproduce the surface treatment for the anodes 2, the surface of the anodes 2 may be corroded (dissolved), or treating the surface of a single anode 2 uniformly or the surface of a plurality of anodes uniformly may be difficult because the concentration of the solution may change greatly due to an increased amount of the solvent that is evaporated. If the temperature is below the above range, the contact step may take an excessively long time.

The contact step may be carried out for a time that is determined appropriately in view of the solution concentration or the temperature of the contact treatment.

The contact step may be performed at atmospheric pressure, and therefore complicated operations of vacuum chambers or the like may be eliminated.

According to the surface treatment methods (α), the work function of the anodes 2 may be increased. Herein, the words "the work function may be increased" mean that the absolute value of the work function is large.

For example, ITO electrodes as anodes 2 usually have a work function of about −4.8 eV without the contact treatment. According to the surface treatment methods (α), the work function (absolute value) may be increased to −5.0 eV or above, and preferably −5.2 to −6.0 eV, although the result may be variable depending on the surface condition of the anodes 2 before the surface treatment.

The work function in the invention is determined by ultraviolet photoelectron spectroscopy in the air.

The surface treatment methods (α) can increase the smoothness of the treated surface of the anodes 2. In the case of ITO electrodes as anodes 2, the surface roughness (Ra) of the ITO electrodes that are surface-treated is preferably not more than 0.6 nm, and more preferably not more than 0.4 nm, although the result may be variable depending on the surface treatment conditions.

If anodes 2 with a rough surface are used, the projections on the surface of the anodes 2 will create pinholes in the emitting layers, and the organic EL devices 5 will have short circuits or leakage current. In contrast, the anodes 2 that are surface-treated by the surface treatment method (α) have a smooth surface and the use of such anodes will prevent short circuits and reduce the leakage current in the organic EL devices 5.

The use of the anodes 2 surface-treated by the surface treatment method (α) increases the luminous efficiency of the organic EL devices 5 and extends the emission lifetime. Further, such anodes make it possible that emitting layers which are uniform and have high smoothness can be formed thereon, and consequently organic EL devices 5 can be manufactured which have a quality emitting surface without uneven brightness or defects and have no leakage current.

The mechanism of the surface treatment for the anodes 2 by the surface treatment method (α) is not fully understood. The present inventors, however, assume that the anodes 2 are surface treated in the following mechanism.

The alkaline solution contains silicate ions. The silicate ions adsorb on the anodes 2 to cover the entire surface thereof. The silicate ions then undergo redox reaction with the surface of the anodes 2 or react with carbonate ions or the like originating from the air, thereby forming a silicon oxide thin layer on the surface of the anodes 2.

The increased work function of the anodes 2 is probably attributed to the silicon oxide thin layer.

The thin layer will be also responsible for the increased smoothness on the surface of the anodes 2.

Provided that the silicon oxide thin layer is formed on the surface of the anodes 2 and in view of the fact that the thin layer will have high insulating properties, such high insulating properties will contribute to improvement in emission lifetime of the organic EL devices (J. Li et al., Synthetic Metals 151 (2005) 141-146).

As compared with anodes 2 without the surface treatment, the anodes 2 that have been surface-treated by the surface treatment method (α) have higher wettability with polymer compound solutions that are used to form organic EL layers 3. Accordingly, the anodes 2 that have been surface-treated by the surface treatment method (α) permit uniform application of a polymer compound solution on the anodes 2 and thereby allow for the fabrication of uniform organic EL layers 3.

In the case of ITO electrodes as anodes 2, the contact angle of the ITO electrodes with water is about 10 to 90° before the surface treatment while that after the surface treatment is less than 10°, although the result may be variable depending on the surface treatment conditions.

<Washing Step>

If the anodes 2 are left standing after the contact step while the solution still remains on the anode surface, the surface treatment on the anodes 2 proceeds to a further extent or the solvent evaporates to leave the solute precipitated on the surface of the anodes 2. When such anodes are used, the obtainable organic EL devices 5 may have electric short circuits or the emitting surface thereof may be damaged. To prevent these problems, the surface treatment methods (α) preferably include a washing step of washing the anodes 2 with water after the contact step thereby to remove the solution from the surface of the anodes 2 after the contact step.

The washing methods include a brush washing method (in which the anodes 2 or the anode-mounted substrate 11 is washed with a rotating roll brush while applying water to the anodes 2 or the anode-mounted substrate 11), a two-fluid washing method (in which compressed air (pressurized at 0.2 to 1.0 MPa) and water (pressurized at 0.2 to 1.0 MPa) are injected to the anodes 2 or the anode-mounted substrate 11 through a nozzle simultaneously to wash the anodes 2 or the anode-mounted substrate 11), an ultrasonic washing method (in which ultrasonicated water is injected to the anodes 2 or the anode-mounted substrate 11 through a nozzle containing an ultrasonic oscillator to wash the anodes 2 or the anode-mounted substrate 11), and a high-pressure jet washing method (in which water pressurized at 0.2 to 10.0 MPa is injected to the anodes 2 or the anode-mounted substrate 11 to wash the anodes 2 or the anode-mounted substrate 11). These washing methods ensure more reliable removal of the solution. The materials for the brushes used in the brush washing method include nylons, polyester resins and polyvinyl alcohol resins.

In the case of the brush washing method, the anodes 2 or the anode-mounted substrate 11 is preferably brought into contact with water beforehand (for example, water may be injected to the anodes 2 or the substrate, or the anodes 2 or the substrate may be soaked in water) in order to remove the solution more reliably.

<Heating Step>

In a preferred embodiment, the surface treatment methods (α) further include a heating step of heating the anodes 2 to 60 to 250° C., and preferably 80 to 200° C. after the washing step. The heating step is carried out before the organic EL layer 3 is formed. The means for heating include infrared ray irradiation, hot air application, halogen lamp irradiation and ultraviolet irradiation using UV lamps or the like.

The heating step increases the effects of the surface treatment for the anodes 2. (For example, luminous efficiency of the organic EL devices 5 is improved.)

The heating step increases the luminous efficiency probably in the following exemplary mechanism. If water used in the contact step remains on part of the anode 2 or hydroxyl groups ($\equiv$Si—OH) are formed in the contact step, the residual water or water formed from the hydroxyl groups passes through an emitting layer (an organic EL layer 3) over time and deteriorates a cathode buffer layer made of Ba, Ca or alkali metal, resulting in lowered luminous efficiency. The heating step dehydrates the surface of the anodes 2 and prevents the deterioration of cathode buffer layers, leading to improved luminous efficiency.

To prevent water or organic substances from adsorbing to the surface of the anodes 2 or the anode-mounted substrate 11 subjected to the heating step, it is preferable that the anodes 2 or the anode-mounted substrate 11 is transferred to an atmosphere (for example, nitrogen, argon or dried air) containing no water or organic substances immediately after the heating treatment. It is more preferable that the heating step is performed in such an atmosphere.

<UV Irradiation Step>

In a preferred embodiment, the surface treatment methods (α) further include a UV irradiation step of irradiating the anodes 2 with UV rays (wavelength region: 200 to 400 nm) after the washing step. The heating step is carried out before the organic EL layer 3 is formed. In an embodiment where the surface treatment method (α) includes the above heating step, the UV irradiation step may be performed before, after or simultaneously with the heating step.

The UV light sources include high pressure mercury lamps, medium pressure mercury lamps, low pressure mercury lamps, xenon lamps, metal halide lamps and deuterium lamps.

The UV irradiation dose on the objects (the anodes 2 or the anode-mounted substrates 11) is preferably in the range of 0.01 to 10 J/cm$^2$.

The UV irradiation dose is preferably uniform over the entire surface of the anodes 2 or the anode-mounted substrate 11. When UV rays cannot be applied to the entire surface at a time, the entire surface may be irradiated by moving the anodes 2 or the anode-mounted substrate 11 or by moving the UV light source.

<E. Organic EL Layers>

Examples of the emitting compounds for forming the emitting layers include luminescent low molecular weight compounds and luminescent high molecular weight compounds described in Yutaka Omori, Oyo Butsuri (Applied Physics), Vol. 70, No. 12, pp. 1419-1425 (2001). Of these compounds, luminescent high molecular weight compounds are preferred because the device production process may be simplified. Fluorescent compounds and phosphorescent compounds may be used, and phosphorescent compounds are preferred in view of high luminous efficiency. Accordingly, phosphorescent high molecular weight compounds are particularly preferable. Examples of the luminescent low molecular weight compounds include triphenylamine derivatives such as N,N'-diphenyl-N,N'-(3-methylphenyl)-1,1'-biphenyl-4,4'-diamine (TPD), 4,4'-bis[N-(1-naphthyl)-N-phenylamino]biphenyl (α-NPD) and 4,4',4"-tris(3-methylphenylphenylamino)triphenylamine (m-MTDATA), quinolinol derivative metal complexes such as tris(8-hydroxyquinolinato)aluminum (III) (Alq3), oxadiazole derivatives, triazole derivatives, imidazole derivatives and triadine derivatives.

The structures of the phosphorescent high molecular weight compounds are not particularly limited as long as the compounds are high molecular weight compounds emitting phosphorescence at room temperature. Specific examples include high molecular weight structures which have conjugated high molecular weight structures as skeletons such as poly(p-phenylenes), poly(p-phenylenevinylenes), polyfluorenes, polythiophenes, polyanilines, polypyrroles and polypyridines, and in which phosphorescent moieties (typically monovalent or divalent groups derived from transition metal complexes or rare earth metal complexes as will be described later) are bonded to the skeletons. In the high molecular weight structures, the phosphorescent moieties may be incorporated in the main chains or side chains.

Other examples of the high molecular weight structures of the phosphorescent high molecular weight compounds include high molecular weight structures which have non-conjugated high molecular weight structures as skeletons such as polyvinylcarbazole, polysilanes and polytriphenylamines, and in which phosphorescent moieties are bonded to the skeletons. In the high molecular weight structures, the phosphorescent moieties may be incorporated in the main chains or side chains.

Still other examples of the high molecular weight structures of the phosphorescent high molecular weight compounds include dendrimers having phosphorescent moieties. In this case, the phosphorescent moieties may be incorporated in the central cores, branches or terminals of the dendrimers.

The above high molecular weight structures emit phosphorescence from the phosphorescent moieties bonded to the conjugated or non-conjugated skeletons. Structures may be used in which the conjugated or non-conjugated skeleton itself can emit phosphorescence.

From the viewpoints of freedom in material design, relatively easy phosphorescence emission, easy synthesis and high solubility in solvents and consequent easy preparation of solutions, phosphorescent high molecular weight compounds which have a non-conjugated high molecular weight structure as a skeleton and in which a phosphorescent moiety is bonded to the skeleton (hereinafter, referred to as the non-conjugated phosphorescent polymers) are preferable.

The non-conjugated phosphorescent polymers have phosphorescent moieties and carrier transporting moieties. Depending on how the phosphorescent moieties and the carrier transporting moieties are bonded, representative high molecular weight structures are: (1) structures in which the phosphorescent moieties and the carrier transporting moieties are in the main chains of the polymers, (2) structures in which the phosphorescent moieties are in side chains of the polymers and the carrier transporting moieties are in the main chains of the polymers, (3) structures in which the phosphorescent moieties are in the main chains of the polymers and the carrier transporting moieties are in side chains of the polymers, and (4) structures in which the phosphorescent moieties and the carrier transporting moieties are in side chains of the polymers.

The high molecular weight structures may have a crosslinked structure. Alternatively, the hole transporting compound, the electron transporting compound and the emitting compound may form independent single polymers (homopolymers) without bonding together, or two kinds of these compounds may be polymerized to give a polymer. At least one of the three kinds of compounds, namely the hole transporting compound, the electron transporting compound and the emitting compound should be a high molecular weight compound, and the other compound(s) may be present as low molecular weight compound(s).

The non-conjugated phosphorescent polymers may have two or more kinds of phosphorescent moieties (each may be present in the main chain or side chain), or may have two or more kinds of carrier transporting moieties (each may be present in the main chain or side chain, or may not be bonded).

The weight average molecular weight of the non-conjugated phosphorescent polymers is preferably 1,000 to 1,000,000, and more preferably 10,000 to 500,000.

The phosphorescent moieties may be monovalent groups or divalent or multivalent groups derived from compounds which emit phosphorescence at room temperature. Monovalent or divalent groups derived from transition metal complexes or rare earth metal complexes are preferred. Examples of the transition metals used in the transition metal complexes include the first transition element series of the periodic table, namely from atomic number 21 Sc to atomic number 30 Zn, the second transition element series, namely from atomic number 39 Y to atomic number 48 Cd, and the third transition element series, namely from atomic number 72 Hf to atomic number 80 Hg. Examples of the rare earth metals for use in the rare earth metal complexes include the lanthanoid series of the periodic table, namely from atomic number 57 La to atomic number 71 Lu.

Examples of the ligands in the transition metal complexes and the rare earth metal complexes include ligands described in G. Wilkinson (Ed.), Comprehensive Coordination Chemistry (Plenum Press, 1987), and Akio Yamamoto, Yuki Kinzoku Kagaku—Kiso to Oyo—(Organic Metal Chemistry—Fundamentals and Applications—) (SHOKABO PUBLISHING Co., Ltd., 1982). In particular, preferred ligands are halogen ligands, nitrogen-containing heterocyclic ligands (including phenylpyridine ligands, benzoquinoline ligands, quinolinol ligands, bipyridyl ligands, terpyridine ligands and phenanthroline ligands), diketone ligands (including acetylacetone ligands and dipivaloylmethane ligands), carboxylic acid ligands (including acetic acid ligands), phosphorus ligands (including triphenylphosphine ligands and phosphite ligands), carbon monoxide ligands, isonitrile ligands and cyano ligands. The metal complexes may contain a plurality of ligands. Also, the metal complexes may be binuclear or polynuclear complexes.

The carrier transporting moieties may be monovalent groups or divalent or multivalent groups having hole transporting properties, electron transporting properties or bipolar properties with both hole transporting properties and electron transporting properties. Examples of the carrier transporting moieties having hole transporting properties include monovalent or divalent groups derived from carbazole, triphenylamine and N,N'-diphenyl-N,N'-(3-methylphenyl)-1,1'-biphenyl-4,4'-diamine (TPD). Examples of the carrier transporting moieties having electron transporting properties include monovalent or divalent groups derived from quinolinol derivative metal complexes such as tris(8-hydroxyquinolinato) aluminum (III) ($Alq_3$), oxadiazole derivatives, triazole derivatives, imidazole derivatives and triazine derivatives, and boron compounds. Examples of the carrier transporting moieties having bipolar properties include monovalent or divalent groups derived from 4,4'-N,N'-dicarbazole-biphenyl (CBP).

The emitting layer may be formed of the phosphorescent high molecular weight compound or the conjugated polymer alone. To supplement the carrier transporting properties of the phosphorescent high molecular weight compound or the conjugated polymer, a composition thereof with other carrier transporting compound may be used to form the emitting layer. In detail, an electron transporting compound may be mixed to the phosphorescent high molecular weight compound when it has hole transporting properties, and a hole transporting compound may be mixed to the phosphorescent high molecular weight compound when it has electron transporting properties. Here, the carrier transporting compounds mixed with the phosphorescent high molecular weight compounds may be low molecular weight compounds or high molecular weight compounds.

Examples of the low molecular weight hole transporting compounds which may be mixed with the phosphorescent high molecular weight compounds include known hole transporting compounds, including triphenylamine derivatives such as N,N'-diphenyl-N,N'-(3-methylphenyl)-1,1'-biphenyl-4,4'-diamine (TPD), 4,4'-bis[N-(1-naphthyl)-N-phenylamino]biphenyl (α-NPD) and 4,4',4''-tris(3-methylphenylphenylamino)triphenylamine (m-MTDATA). Examples of the high molecular weight hole transporting compounds which may be mixed with the phosphorescent high molecular weight compounds include polyvinylcarbazole and polymers obtained by introducing polymerizable functional groups into triphenylamine-based low molecular weight compounds followed by polymerization, such as high molecular weight compounds having a triphenylamine skeleton as disclosed in Patent Literature JP-A-H08-157575.

Examples of the low molecular weight electron transporting compounds which may be mixed with the phosphorescent high molecular weight compounds include quinolinol derivative metal complexes such as tris(8-hydroxyquinolinato)aluminum (III) ($Alq_3$), oxadiazole derivatives, triazole derivatives, imidazole derivatives and triazine derivatives. Examples of the high molecular weight electron transporting compounds which may be mixed with the phosphorescent high molecular weight compounds include polymers obtained by introducing polymerizable functional groups into the above low molecular weight electron transporting compounds followed by polymerization, such as poly-PBD disclosed in Patent Literature JP-A-H10-1665.

To improve properties of the layers obtained from the phosphorescent high molecular weight compounds, a high molecular weight compound that is not directly involved with emission properties of the phosphorescent high molecular weight compounds may be mixed therewith to give a composition for use as the emitting compound. For example, polymethyl methacrylate (PMMA) or polycarbonate may be mixed to impart flexibility to the obtainable layers.

The thickness of the emitting layers is preferably 1 nm to 1 μm, more preferably 5 nm to 300 nm, and still more preferably 10 nm to 100 nm.

In the organic EL devices of the present invention, examples of the hole transporting compounds for forming the hole transporting layers include known low molecular weight hole transporting compounds such as triphenylamine derivatives including N,N'-dimethyl-N,N'-(3-methylphenyl)-1,1'-biphenyl-4,4'-diamine (TPD), 4,4'-bis[N-(1-naphthyl)-N-phenylamino]biphenyl (α-NPD) and (4,4',4''-tris(3-methylphenylphenylamino)triphenylamine (m-MTDATA), and polyvinyl carbazole.

High molecular weight hole transporting compounds may also be used, with examples including polymers obtained by introducing polymerizable functional groups into triphenylamine-based low molecular weight compounds followed by polymerization, such as high molecular weight compounds having a triphenylamine skeleton as disclosed in Patent Literature JP-A-H08-157575, and high molecular weight compounds such as polyparaphenylenevinylene and polydialkylfluorene. The hole transporting compounds may be used singly, or may be mixed or laminated with differing hole transporting compounds. The thickness of the hole transporting layers is preferably 1 nm to 5 μm, more preferably 5 nm to 1 μm, and still more preferably 10 nm to 500 nm.

In the organic EL devices of the present invention, examples of the electron transporting compounds for forming the electron transporting layers include known low molecular weight electron transporting compounds such as quinolinol derivative metal complexes including tris(8-hydroxyquinolinato)aluminum (III) ($Alq_3$), oxadiazole derivatives, triazole derivatives, imidazole derivatives and triazine derivatives. High molecular weight electron transporting compounds may also be used, with examples including polymers obtained by introducing polymerizable functional groups into the above low molecular weight electron transporting compounds followed by polymerization, such as poly-PBD disclosed in Patent Literature JP-A-H10-1665. The electron transporting compounds may be used singly, or may be mixed or laminated with differing electron transporting compounds.

The thickness of the electron transporting layers is preferably 1 nm to 5 μm, more preferably 5 nm to 1 μm, and still more preferably 10 nm to 500 nm.

The phosphorescent high molecular weight compound can singly form an emitting layer, and the same applies to the hole transporting compound for a hole transporting layer and the electron transporting compound for an electron transporting layer. Alternatively, each of these layers may involve a high molecular weight compound as a binder. Examples of the high molecular weight compounds used herein include polymethyl methacrylates, polycarbonates, polyesters, polysulfones and polyphenylene oxides.

The emitting layer, the hole transporting layer and the electron transporting layer may be formed by methods such as resistance heating evaporation, electron beam deposition, sputtering, inkjet printing, spin coating, dip coating, printing, spraying and dispenser printing. In the case of the low molecular weight compounds, the resistance heating evaporation and electron beam deposition are mainly used. For the high molecular weight compounds, the inkjet printing and spin coating are usually used.

Part of the organic EL layers 3 formed on the anode-mounted substrate 11 is selectively removed by plasma treatment as will be described later.

To prevent holes from passing through the emitting layer and to ensure that the holes are recombined with electrons in the emitting layer more efficiently, a hole blocking layer may be provided adjacent to the emitting layer on the cathode side. The hole blocking layer may be produced using a compound that has a highest occupied molecular orbital (HOMO) level deeper than that of the emitting compounds, with examples including triazole derivatives, oxadiazole derivatives, phenanthroline derivatives and aluminum complexes.

Further, an exciton blocking layer may be provided adjacent to the emitting layer on the cathode side to prevent the excitons from being deactivated by the cathode metal. The exciton blocking layer may be formed using a compound that has an excited triplet energy higher than the emitting compounds, with examples including triazole derivatives, phenanthroline derivatives and aluminum complexes.

<F. Cathodes>

The materials for the cathodes 4 may be known cathode materials that have a low work function and are chemically stable, with examples including Al, MgAg alloy and alloys of Al and alkali metals such as AlLi and AlCa. In view of chemical stability, it is preferable to use materials having a work function of not less than 2.9 eV. These cathode materials may be formed into layers by methods such as resistance heating evaporation, electron beam deposition, sputtering and ion plating. The thickness of the cathodes is preferably in the range of 10 nm to 1 μm, and more preferably 50 to 500 nm.

To lower the electron injection barrier from the cathode 4 to the organic EL layers 3 and thereby to increase the electron injection efficiency, a cathode buffer layer of a metal having a lower work function than the cathode 4 may be interposed between the cathode 4 and the organic EL layer 3 adjacent to the cathode 4. Examples of the low work function metals include alkali metals (Na, K, Rb and Cs), alkaline earth metals (Sr, Ba) and rare earth metals (Pr, Sm, Eu and Yb). Further, alloys and metal compounds may be used as long as their work functions are lower than that of the cathode. The cathode buffer layers may be produced by methods such as deposition and sputtering. The thickness of the cathode buffer layers is preferably in the range of 0.05 to 50 nm, more preferably 0.1 to 20 nm, and still more preferably 0.5 to 10 nm.

In an embodiment, the cathode buffer layer may be formed of a mixture of the above low work function substance and an electron transporting compound. The electron transporting compounds used herein may be the organic compounds used in the electron transporting layers described above. Such cathode buffer layers may be formed by a codeposition method. In the case where such layers can be formed by the application of a solution, nozzle coating according to the invention may be adopted and, for the entire coating, methods such as spin coating, dip coating and spraying may be used. The thickness of such cathode buffer layers is preferably in the range of 0.1 to 100 nm, more preferably 0.5 to 50 nm, and still more preferably 1 to 20 nm.

<G. Sealing Members>

In the sealed organic EL device 10 manufactured according to the present invention, the organic EL device 5 is accommodated in a closed space 7 defined by the substrate 1 and the sealing member 6 bonded to the substrate 1, which member has an opening on the substrate 1 side. The organic EL device 5 thus has long-term stability.

The sealing members 6 may be glass plates, plastic plates having a surface with lowered water permeability, and metal plates. The sealing member 6 is bonded to the substrate 1 through a thermosetting resin or a photocurable resin to create a closed space 7, and the organic EL device 5 is housed therein, thereby facilitating the prevention of the organic EL devices 5 from scratches.

Filling the closed spaces 7 with inert gases such as nitrogen and argon prevents the oxidation of the cathodes 4. The placement of desiccants such as barium oxide in the closed spaces 7 makes it easily possible to suppress water that has adsorbed on the organic EL devices 5 during the manufacturing from causing damages to the devices.

Processes for Manufacturing Sealed Organic EL Devices

FIG. 2 shows an embodiment of the processes for manufacturing sealed organic EL devices 10 according to the invention. As illustrated in the figure, the process for manufacturing sealed organic EL devices 10 of the invention includes:

a step (A) of forming the organic EL layer 3 on a region of the anode-mounted substrate 11 including the substrate 1 and the anode 2, the region including at least a bonding region 12 in which the sealing member 6 will be bonded and a region which is found inward the bonding region, a step (B) of removing a portion of the organic EL layer 3 which is found at least on the bonding region 12 by applying plasma by a remote plasma method to expose the bonding region 12, a step (C) of forming the cathode 4 on the organic EL layer 3 to complete the organic EL device 5, and a step (D) of bonding the sealing member 6 to the exposed bonding region 12.

In the step (A), the organic EL layer 3 is formed on a region of the anode-mounted substrate 11 including the substrate 1 and the anode 2. The region includes at least a bonding region 12 in which the sealing member 6 will be bonded and a region which is found inward the bonding region.

In the step (B), a portion of the organic EL layer 3 which is found at least on the bonding region 12 is removed by applying plasma by a remote plasma method to expose the bonding region 12.

The portion which is found on the bonding region 12 is removed by applying plasma thereto by a remote plasma method, and thereby the bonding region 12 is exposed easily while suppressing damages to an emitting region 31. The bonding region 12 is activated by the plasma application to achieve higher adhesion with the sealing member 6 than when the organic EL layer 3 is removed with, for example, a solvent.

The plasma application takes place before the cathode is formed, and therefore active gas species generated by the plasma application do not deteriorate the cathode. In the case where a carbon fluoride thin layer as the anode buffer layer 21 is formed under the organic EL layer 3 (FIG. 3), the carbon fluoride thin layer is removed together with the organic EL layer 3.

The plasma application by a remote plasma method may involve a known apparatus. For example, a surface treatment apparatus described in Patent Literature 3 (claim 13) may be used which has a discharge tube of dielectric material that defines a gas flow channel between a base end connected to a discharge gas supply source and an open front end facing an object to be treated, and which further has a power electrode and a grounding electrode arranged on the upstream and downstream side of the gas flow channel along the discharge tube which electrodes cause the discharge gas to generate gaseous discharge in the discharge tube at or around atmospheric pressure.

As illustrated in FIG. 4, the step (A) may form the organic EL layer 3 on a region of the anode-mounted substrate 11 which includes at least the bonding region 12 in which the sealing member 6 will be bonded, a region which is found inward the bonding region and further an external power connecting region 13 on the anode 2 which will be connected with an external power 8, and the step (B) may remove a portion of the organic EL layer 3 which is found at least on the bonding region 12 and on the external power connecting region 13 by applying plasma by a remote plasma method to expose the bonding region 12 and the external power connecting region 13. The external power 8 may be connected to the exposed external power connecting region 13 by a known method.

The discharge gas preferably does not contain fine particles, which can contaminate the surface of the anode-mounted substrate 11, as much as possible. To remove such fine particles, the discharge gas is preferably supplied to the plasma generator through a filter. The filter is preferably capable of removing fine particles having a diameter of 0.05 µm or more.

Preferred discharge gases include $N_2$, He, $O_2$, Ar, $CO_2$ and air, with air, $O_2$, Ar and $CO_2$ being particularly preferred.

In the background art, for example, part of an organic EL layer 3 is removed with a solvent, in which case waste solvents are caused or the evaporated solvents often damage or contaminate the organic EL layer 3 around the part removed. Further, the conventional partial removal of an organic EL layer 3 by a direct plasma irradiation method can often damage anodes 2 by electric discharge to the anodes 2, or plasma that spreads avoiding an insulator interposed between the electrodes can damage regions of the organic EL layer 3 which should remain intact.

In contrast, the plasma application by a remote method according to the invention does not cause problems associated with waste solvents or damages to the anodes, and also prevents damages to the organic EL layer 3 remaining in the vicinity of the part removed.

To expose the bonding region 12 in which the sealing member 6 will be bonded, plasma may be applied by a remote method onto an area of the organic EL layer 3 which is on the bonding region 12 scheduled to be joined with the sealing member 6, in a manner such that the plasma is continuously applied to the area so as to draw substantially the same profile as the bonding region 12, thereby removing the area of the organic EL layer 3 that has been irradiated with the plasma. The plasma may be continuously applied to draw substantially the same profile as the bonding region 12 by:

(i) a method in which the anode-mounted substrate 11 having the organic EL layer 3 is fixed, and a plasma irradiation member p1 is moved;

(ii) a method in which a plasma irradiation member p1 is fixed, and the anode-mounted substrate 11 having the organic EL layer 3 is moved; or (iii) a method in which both the anode-mounted substrate 11 having the organic EL layer 3, and a plasma irradiation member p1 are moved.

In the remote method, plasma may be applied vertically to the in-plane direction of the organic EL layer 3 or may be applied at an inclined angle (inclined angle α (α<90°)) relative to the in-plane direction of the organic EL layer 3. The direction of plasma application may be altered by controlling the angle of the plasma irradiation member (head) p1 of a plasma irradiator relative to the organic EL layer 3.

When plasma is applied by a remote method at an inclined angle (inclined angle α (α<90°)) relative to the in-plane direction of the organic EL layer 3 as illustrated in FIG. 5 (A), a region 3' of the organic EL layer 3 in the vicinity of the part removed is damaged. (This region is not removed and remains after the plasma application, but lowers emission brightness when it functions as an emitting region. (For example, the emission brightness is ⅔ or less of the brightness of the emitting region 31 which provides normal emission.) Such regions will be also referred to as the damaged regions 3'.) As shown in FIG. 5(B), the damaged region tends to be extensive ahead of the plasma application direction and be narrow behind the plasma application direction.

Accordingly, from the viewpoint that the damaged region 3' should be reduced, it is preferable to apply plasma toward the outside of the bonding region 12. In detail, plasma is preferably applied such that a region of the organic EL layer 3 in which the cathode 4 will be laminated and which consequently functions as the emitting region 31, is behind the plasma application direction. In the case where the plasma application is performed while the anode-mounted substrate 11 having the organic EL layer 3 is moved, an automatic stage having a θ axis may be used to direct the plasma application direction toward the outside of the bonding region 12.

As illustrated in FIG. 6(A), a barrier 91 may be provided on the organic EL layer 3 in performing the plasma application. According to such an embodiment, the damaged region 3' can be reduced compared to when the barrier 91 is not provided (FIG. 6(B)), probably because the barrier 91 blocks a stream which damages the organic EL layer 3. The barriers 91 may be made of any materials that are not deteriorated or deformed by the heat generated by plasma. Specific examples include glass plates, metal plates (iron, stainless steel, aluminum, brass, copper, titanium) and ceramic plates (alumina, boron nitride).

An embodiment of the processes for manufacturing sealed organic EL devices 10 is illustrated in FIG. 7. As illustrated, a plurality of organic EL devices 5 are created on a single substrate 1, each organic EL device 5 is sealed, and the substrate including each sealing member is divided into a plurality of sealed organic EL devices 10.

A plurality of barriers 91 may be provided as shown in FIG. 6(C). The mode of plasma application illustrated in FIG. 6(C) is advantageous in that the damaged region 3' in each organic EL device 5 can be reduced, particularly in an embodiment shown in FIG. 7 wherein plasma is applied by a remote plasma method to remove parts of the organic EL layer 3 which are found on the bonding regions 12 (bonding regions 12A in FIG. 7) between regions where the organic EL devices will be formed.

As shown in an embodiment in FIG. 8(A), the anode-mounted substrate 11 having the organic EL layer 3 may be placed on a heatsink 92 while plasma is applied thereto. According to this embodiment, the damaged region 3' may be reduced compared to when no heatsink 92 is used (FIG. 8(B)), probably because the heatsink 92 suppresses the generation of heat at the area of the organic EL layer 3 that is irradiated with plasma. The heatsinks 92 may be made of any materials that have high heat conductivity. Specific examples include metal plates (aluminum, copper, iron, brass, titanium).

In the step (C), the cathode 4 is formed on the organic EL layer 3 remaining inside the bonding region 12 to complete the organic EL device 5.

In the step (D), the sealing member 6 is bonded to the exposed bonding region 12.

The region of the organic EL layer 3 that remains outside the bonding region 12 may be removed or may remain. Such regions may be removed by means such as plasma application described above or may be dissolved with solvents.

EXAMPLES

The present invention will be described in greater detail based on examples and comparative examples without limiting the scope of the invention.

Production Example 1

Production of Emitting High Molecular Weight Compound

A phosphorescent high molecular weight compound was obtained by copolymerizing the following monomers: an iridium complex having a polymerizable substituent group (a compound represented by Formula E-1), a hole transporting compound (a compound represented by Formula E-2) and an electron transporting compound (a compound represented by Formula E-3).

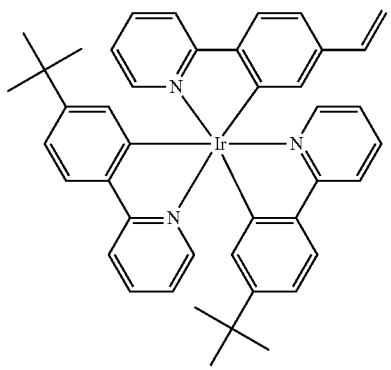

(E-1)

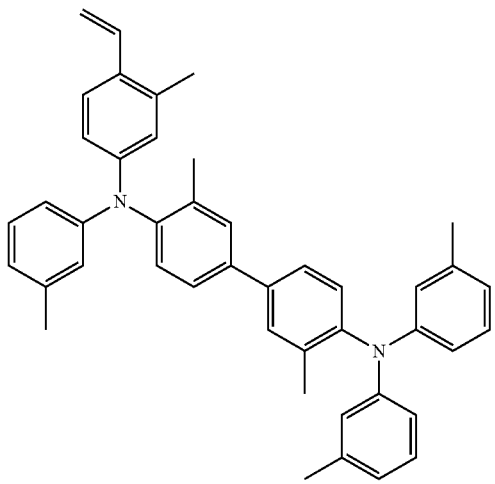

(E-2)

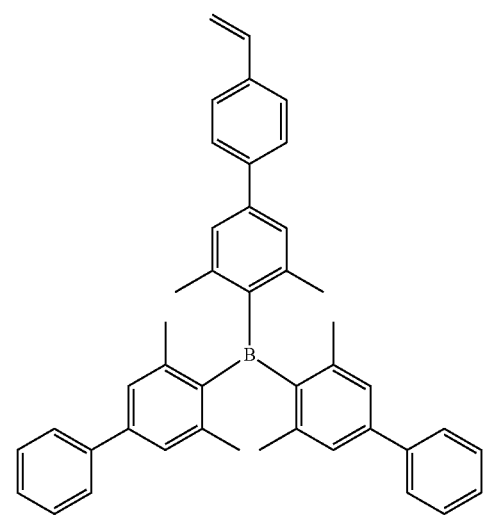

(E-3)

In detail, the monomers in a ratio (a weight ratio of the monomers fed) of (E-1):(E-2):(E-3)=1:4:5 and polymerization initiator V-601 (manufactured by Wako Pure Chemical Industries, Ltd.) were dissolved in a dried toluene solution. The solution was frozen, degassed, vacuumed and stirred at 70° C. for 100 hours. After the reaction, the reaction liquid was dropped to acetone to cause precipitation. The precipitate was purified by performing three cycles of reprecipitation from toluene to acetone. The acetone and toluene used herein were distillates of high-purity grade products (manufactured by Wako Pure Chemical Industries, Ltd.). The solvent after each reprecipitation was analyzed by high performance liquid chromatography, which confirmed that the solvent after the third reprecipitation contained no substances showing absorption peaks at 400 nm or above. After impurities in the phosphorescent high molecular weight compound were removed as described above, the phosphorescent high molecular weight compound was vacuum dried at room temperature for 2 days. High performance liquid chromatography (detection wavelength: 254 nm) confirmed that the phosphorescent high molecular weight compound had a purity of more than 99.9%.

The phosphorescent high molecular weight compound was dissolved in toluene in a nitrogen atmosphere to give a solution A.

Example 1

An anode-mounted substrate 11 in which a transparent ITO (indium tin oxide) anode 2 was formed on a glass substrate 1 (125 mm×125 mm square) was ultrasonically washed with a commercially available detergent and rinsed with ultrapure water. The contact angle of the anode surface to water was 25°.

After the washing, the anode-mounted substrate 11 was dried and placed in a plasma generator. Oxygen gas was introduced into the generator, and an alternating voltage was applied to the generator to discharge oxygen plasma. The anode substrate 11, namely the anode-mounted substrate 11 was irradiated with the plasma by a direct method. The pressure in the generator was 2 Pa (controlled by means of the oxygen gas flow rate), the input power was 100 W, and the treatment time (the plasma application time) was 40 seconds.

Subsequently, the anode-mounted substrate 11 was plasma treated under the same conditions as above except that the gas introduced was changed from oxygen gas to $CHF_3$ gas.

By the plasma treatment, the contact angle of the anode surface to water was increased to 70°, which confirmed that the surface of the anode-mounted substrate had been rendered water-repellent.

The entire surface of the anode side of the anode-mounted substrate 11 after the plasma treatment was spin coated with the solution A from Production Example 1 (rotation: 3000 rpm, rotation time: 30 seconds). The coating was dried in the dark in a vacuum dryer under reduced pressure at 100° C. for 1 hour to form an organic EL layer 3. The organic EL layer 3 had a thickness of 80 nm (step measurement, measurement apparatus: atomic force microscope (VN-8010 manufactured by KEYENCE CORPORATION)) and a contact angle to water of 100°.

Subsequently, an area of the organic EL layer 3 that was found on a bonding region 12 for a sealing member 6 on the anode-mounted substrate 11 was irradiated with plasma in the following manner.

The anode-mounted substrate having the organic EL layer 3 (hereinafter, also the emitting layer-mounted substrate) was placed on a triaxial automatic stage. A plasma irradiation member (head) p1 of an atmospheric plasma applicator of remote plasma system (Plasma Pen manufactured by PVA TePla America) was fixed on the z-axis of the triaxial automatic stage and immediately above the organic EL layer 3 such that the direction of plasma discharge was perpendicular to the in-plane direction of the emitting layer-mounted substrate and further such that the plasma nozzle of the plasma irradiation member p1 was 1 mm away from the emitting layer-mounted substrate.

Dry air as a discharge gas was supplied to the atmospheric plasma applicator through a line filter (manufactured by IAC. Co., Ltd., hollow filament line filter, model: LF-8, hollow diameter: 0.05 μm) to generate plasma at an increased pressure (0.6 MPa). The plasma was continuously applied to draw an approximately 40 mm square in the order of a→b→c→d→a illustrated in FIG. 9(A) on an area of the organic EL layer 3 that was found on the bonding region 12 for the sealing member 6, by moving the x- and y-axes of the triaxial automatic stage at 40 mm/s.

By the above procedure, the area 3' (linewidth: about 3 mm) of the organic EL layer 3 on the anode-mounted substrate 11 that had been irradiated with plasma was removed. Visual inspection confirmed that the bonding region 12 of the anode-mounted substrate 11 was exposed.

Further, an area of the organic EL layer 3 that was found on an external power connecting region 13 was irradiated with plasma. Visual inspection confirmed that the external power connecting region 13 was exposed.

The exposed surface of the ITO anode 2 had a contact angle to water of 10°, which confirmed that the ITO anode 2 which had been rendered water-repellent by the plasma treatment was hydrophilicized.

The emitting layer-mounted substrate that had been plasma irradiated was placed in a vacuum deposition apparatus, in which a cathode buffer layer (Sr, thickness: 8 nm) and sequentially a cathode 4 (Al, thickness: 100 nm) were formed on an area of the organic EL layer 3 that remained inward the plasma-irradiated area. The resultant organic EL device 5 was taken out from the vacuum deposition apparatus to a glove box in a nitrogen atmosphere.

Separately, a UV curable adhesive was uniformly applied to a rim portion of a sealing cap 6 (a 1.1 mm thick glass plate in which a surface had the rim portion 1 mm in width and a 0.5 mm deep recess inside the rim portion).

The sealing cap was transferred from the atmospheric atmosphere into the glove box. The sealing cap and the organic EL device 5 were joined together such that the adhesive applied to the sealing cap lied on the bonding region 12. UV rays were applied thereto to cure the adhesive, thereby obtaining a sealed organic EL device 10.

An external power 8 was connected to the exposed external power connecting region 13 of the ITO anode 2, and power was applied. The sealed organic EL device 10 was confirmed to emit light.

In an emitting region 31, a region 32 (FIG. 10) which extended approximately 7 mm inward from the exposed anode-mounted substrate 11 had a brightness that was approximately ⅔ or less compared to the brightness in the vicinity of the center of the emitting region 31.

Subsequently, a flexible cable was attached to the exposed external power connecting region 13 through an anisotropic conductive film (ACF) as an adhesive. The external power 8 was connected through the flexible cable, and power was applied. The sealed organic EL device 10 was confirmed to emit light similarly to when the flexible cable was not used.

The bonding of the flexible cable was firm and the cable was not removed readily even when it was moved by hand.

The sealing cap and the substrate were pulled away from each other in the opposite direction in a plane of the substrate. The sealing cap was broken when these were pulled by a force of about 10 kg-weight.

Example 2

In Example 2, a sealed organic EL device 10 was manufactured in the same manner as in Example 1, except that the plasma irradiation member (head) p1 used in Example 1 was inclined (inclined angle α) relative to the organic EL layer 3 and plasma was applied from the plasma nozzle approximately 1 mm away from the emitting layer-mounted substrate as described below.

Prior to the plasma application, the plasma irradiation member p1 was set at an inclined angle α of 45° relative to the organic EL layer 3 as illustrated in FIG. 11(B) for the treatment of a straight section from the point (a) to the point (b) in FIG. 11(A). After the plasma irradiation member p1 was positioned in the above initial position, plasma was continuously applied from the point (a) to the point (b) while keeping the initial position. In this manner, plasma was applied toward the inside of the organic EL layer 3 in the section from the point (a) to the point (b).

Subsequently, plasma was continuously applied from the point (b) to the point (c) with the plasma irradiation member p1 keeping the initial position. In the section from the point (b) to the point (c), the emitting layer-mounted substrate was moved such that the plasma irradiation member p1 followed the plasma p2 applied therefrom as illustrated in FIG. 11(C).

Subsequently, plasma was continuously applied from the point (c) to the point (d) with the plasma irradiation member p1 keeping the initial position. In the section from the point (c) to the point (d), plasma was applied toward the outside of the organic EL layer 3 as illustrated in FIG. 11(D).

Subsequently, plasma was continuously applied from the point (d) to the point (a) with the plasma irradiation member p1 keeping the initial position. In the section from the point (d) to the point (a), the emitting layer-mounted substrate was moved such that the plasma irradiation member p1 backed away from the plasma p2 applied therefrom as illustrated in FIG. 11(E).

By applying plasma continuously through a→b→c→d→a, the bonding region 12 of the anode-mounted substrate 11 was exposed.

An external power 8 was connected to the external power connecting region 13 of the sealed organic EL device 10, and power was applied. The organic EL device 5 was confirmed to emit light.

In an emitting region 31, a region 33 (FIG. 12) which extended approximately 12 mm forward in the plasma application direction from the plasma-irradiated area, and a region 34 (FIG. 12) which extended approximately 5 mm backward against the plasma application direction from the plasma-irradiated area, each had a brightness that was approximately ⅔ or less compared to the brightness in the vicinity of the center of the emitting region 31.

Example 3

In Example 3, a sealed organic EL device 10 was manufactured in the same manner as in Example 1, except that a tetraaxial automatic stage was used and the plasma irradiation member (head) p1 was inclined (inclined angle α=45°) relative to the organic EL layer 3 so that plasma would be applied toward the outside of the organic EL layer 3 as illustrated in FIG. 11(D), and that a θ-axis of the tetraaxial automatic stage was rotated so that the plasma irradiation member would maintain the above position in each of the sections from the point (a) to the point (b), from the point (b) to the point (c), from the point (c) to the point (d), and from the point (d) to the point (a).

An external power 8 was connected to the external power connecting region 13 of the sealed organic EL device 10, and power was applied. The organic EL device 5 was confirmed to emit light.

In an emitting region 31, a region which extended approximately 5 mm inward from the exposed anode-mounted substrate 11 had a brightness that was approximately ⅔ or less compared to the brightness in the vicinity of the center of the emitting region 31.

Example 4

In Example 4, a sealed organic EL device 10 was manufactured in the same manner as in Example 1, except that when the organic EL layer 3 was irradiated with plasma, a glass plate 91 (thickness: 0.7 mm, height: 10 mm) was provided (inclined angle relative to the organic EL layer 3: 45°) on a position of the organic EL layer 3 that was inside an area to be irradiated with plasma (the glass plate 91 and the organic EL layer 3 were in contact at a position approximately 4 mm from the area of the organic EL layer 3 which would be irradiated with plasma) (FIG. 13(B)).

An external power 8 was connected to the external power connecting region 13 of the sealed organic EL device 10, and power was applied. The organic EL device 5 was confirmed to emit light.

In an emitting region 31, a region 32 (FIG. 14) which extended approximately 4 mm inward from the exposed anode-mounted substrate 11 had a brightness that was approximately ⅔ or less compared to the brightness in the vicinity of the center of the emitting region 31.

Example 5

In Example 5, a sealed organic EL device 10 was manufactured in the same manner as in Example 3, except that:

when the organic EL layer 3 was irradiated with plasma as described in Example 3, a 10 mm thick aluminum vacuum suction chuck plate 92 was provided on the tetraaxial automatic stage and the substrate 1 was closely attached on the vacuum suction chuck plate 92 (FIG. 15(B));

the velocity of the plasma irradiation member p1 relative to the emitting layer-mounted substrate was changed to 120 mm/s; and the plasma application through a→b→c→d→a was repeated 4 times.

An external power 8 was connected to the external power connecting region 13 of the sealed organic EL device 10, and power was applied. The organic EL device 5 was confirmed to emit light.

In an emitting region 31, a region 32 (FIG. 16) which extended approximately 2 mm inward from the exposed anode-mounted substrate 11 had a brightness that was approximately ⅔ or less compared to the brightness in the vicinity of the center of the emitting region 31.

REFERENCE SIGNS LIST

1: substrate
11: anode-mounted substrate
12: bonding region
13: external power connecting region
2: anode
21: anode buffer layer
3: organic EL layer
4: cathode
5: organic EL device
6: sealing member
7: closed space
8: external power
10: sealed organic EL device
p1: plasma irradiation member
p2: plasma

The invention claimed is:

1. A process for manufacturing sealed organic electroluminescence devices, the sealed organic electroluminescence device comprising:
a substrate,
a sealing member bonded to the substrate, the sealing member having an opening on the side bonded with the substrate, and
an organic electroluminescence device formed on the substrate, the device being accommodated in a closed space defined by the substrate and the sealing member, the device comprising an anode, an organic electroluminescence layer including at least one emitting layer, and a cathode;

the process comprising:

a step (A) of forming the organic electroluminescence layer on a region of an anode-mounted substrate comprising the substrate and the anode, the region including at least a bonding region in which the sealing member will be bonded and a region which is found inward the bonding region, a step (B) of removing an area of the organic electroluminescence layer on the bonding region by applying plasma by a remote plasma method in a manner such that the plasma is applied to the area so as to draw substantially the same profile as the bonding region to expose the bonding region, a step (C) of forming the cathode on the organic electroluminescence layer to complete the organic electroluminescence device, and a step (D) of bonding the sealing member to the exposed bonding region.

2. The process for manufacturing sealed organic electroluminescence devices according to claim 1, wherein the anode-mounted substrate further comprises an anode buffer layer formed on the anode.

3. The process for manufacturing sealed organic electroluminescence devices according to claim 2, wherein the anode buffer layer comprises carbon fluoride.

4. The process for manufacturing sealed organic electroluminescence devices according to claim 1, wherein the organic electroluminescence layer is formed by an application method.

5. The process for manufacturing sealed organic electroluminescence devices according to claim 1, wherein the step (A) is a step of forming the organic electroluminescence layer on a region of the anode-mounted substrate, the region including at least a bonding region in which the sealing member will be bonded, a region which is found inward the bonding region, and an external power connecting region on the anode which will be connected with an external power, and the step (B) is a step of removing a portion of the organic electroluminescence layer which is found at least on the bonding region and on the external power connecting region by applying plasma by a remote plasma method to expose the bonding region and the external power connecting region.

6. The process for manufacturing sealed organic electroluminescence devices according to claim 1, wherein in the step (B), the plasma is applied by the use of a surface treatment apparatus, which has a discharge tube of dielectric material that defines a gas flow channel between a base end connected to a discharge gas supply source and an open front end facing an object to be treated, and which further has a power electrode and a grounding electrode arranged on an upstream and a downstream side of the gas flow channel along the discharge tube, and wherein the power electrode and the grounding electrode cause the discharge gas to generate gaseous discharge in the discharge tube at or around atmospheric pressure.

7. The process for manufacturing sealed organic electroluminescence devices according to claim 1, wherein in the step (B), the plasma is applied at an inclined angle relative to the in-plane direction of the organic electroluminescence layer so that a region of the organic electroluminescence layer which forms the emitting region is behind the plasma application direction.

8. The process for manufacturing sealed organic electroluminescence devices according to claim 1, wherein in the step (B), the plasma is applied in the presence of a barrier, wherein the barrier is positioned on the organic electroluminescence layer that is inside an area to be irradiated with plasma.

9. The process for manufacturing sealed organic electroluminescence devices according to claim 1, wherein in the step (B), the plasma is applied before the cathode is formed.

* * * * *